United States Patent
Lyons et al.

(10) Patent No.: US 11,570,924 B2
(45) Date of Patent: Jan. 31, 2023

(54) DATA STORAGE DEVICE ADAPTOR WITH SECUREMENT MECHANISM

(71) Applicant: Western Digital Technologies, Inc., San Jose, CA (US)

(72) Inventors: Everett Lyons, San Jose, CA (US); Daniel Linnen, Naperville, IL (US); Randy Gillespie, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 333 days.

(21) Appl. No.: 16/799,757

(22) Filed: Feb. 24, 2020

(65) Prior Publication Data

US 2021/0267083 A1 Aug. 26, 2021

(51) Int. Cl.
```
H05K 7/14      (2006.01)
H05K 5/02      (2006.01)
G06F 3/06      (2006.01)
G06F 1/18      (2006.01)
```
(52) U.S. Cl.
CPC .......... *H05K 7/1402* (2013.01); *G06F 1/183* (2013.01); *G06F 3/0607* (2013.01); *H05K 5/0282* (2013.01)

(58) Field of Classification Search
CPC .... H05K 7/1402; H05K 5/0282; G06F 1/183; G06F 3/0607; G06F 3/0619; G06F 3/0658; G06F 3/0679; G11B 33/122
USPC ...................................................... 361/752
See application file for complete search history.

(56) References Cited

U.S. PATENT DOCUMENTS

| | | | |
|---|---|---|---|
| 8,753,138 B2 | 6/2014 | Foster, Sr. et al. | |
| 10,929,327 B1* | 2/2021 | Schrempp | G06F 13/4068 |
| 2017/0017600 A1* | 1/2017 | Breakstone | G06F 13/4022 |
| 2019/0163245 A1* | 5/2019 | Kho | H05K 7/1409 |

(Continued)

FOREIGN PATENT DOCUMENTS

| | | |
|---|---|---|
| CN | 104078081 A | 10/2014 |
| WO | WO-2021061113 A1 * | 4/2021 |

OTHER PUBLICATIONS

Harmon, W., "Icy Dock EZConvert MB705M2P-B Review M.2 to U.2 NVMe SSD Adapter", Jul. 5, 2019, https://www.servethehome.com/icy-dock-ezconvert-mb705m2p-b-review-m-2-to-u-2-nvme-ssd-adapter/.

(Continued)

*Primary Examiner* — Anatoly Vortman
*Assistant Examiner* — Zhengfu J Feng
(74) *Attorney, Agent, or Firm* — Ravi Mohan; Rutan & Tucker, LLP

(57) ABSTRACT

In one embodiment, an apparatus is provided. The apparatus includes a printed circuit board. The apparatus also includes a first connector coupled to the printed circuit board. The first connector is configured to couple the apparatus to a computing device. The apparatus further includes a second connector coupled to the printed circuit board. The second connector is configured to couple the apparatus to a data storage device. The apparatus further includes a securement mechanism comprising a first portion and a second portion. The securement mechanism is movable about the apparatus between a first position and a second position. The first portion is configured to maintain the securement mechanism at the first position. The second portion is configured to secure the data storage device to the apparatus when the securement mechanism is in the first position.

8 Claims, 17 Drawing Sheets

(56) References Cited

U.S. PATENT DOCUMENTS

2019/0272008 A1* 9/2019 Ping .................... H05K 7/1487
2019/0286197 A1   9/2019 Khan et al.

OTHER PUBLICATIONS

"M.2 SSD to SATA Adapter Card with Latching Quick Release Clip", screen captured Oct. 14, 2019, htttps://www.newegg.com/p/35G-003A-00028.

"2.5" M2/mSATA SSD drive", screen capture Oct. 14, 2019, https://www.addonics.com/product/intro/30.

"EZ-Fit Lite MB290SP-B / MB290SP-1B (W/Cables)", screen capture Oct. 14, 2019, https://www.icydock.com/goods.php?id=165.

* cited by examiner

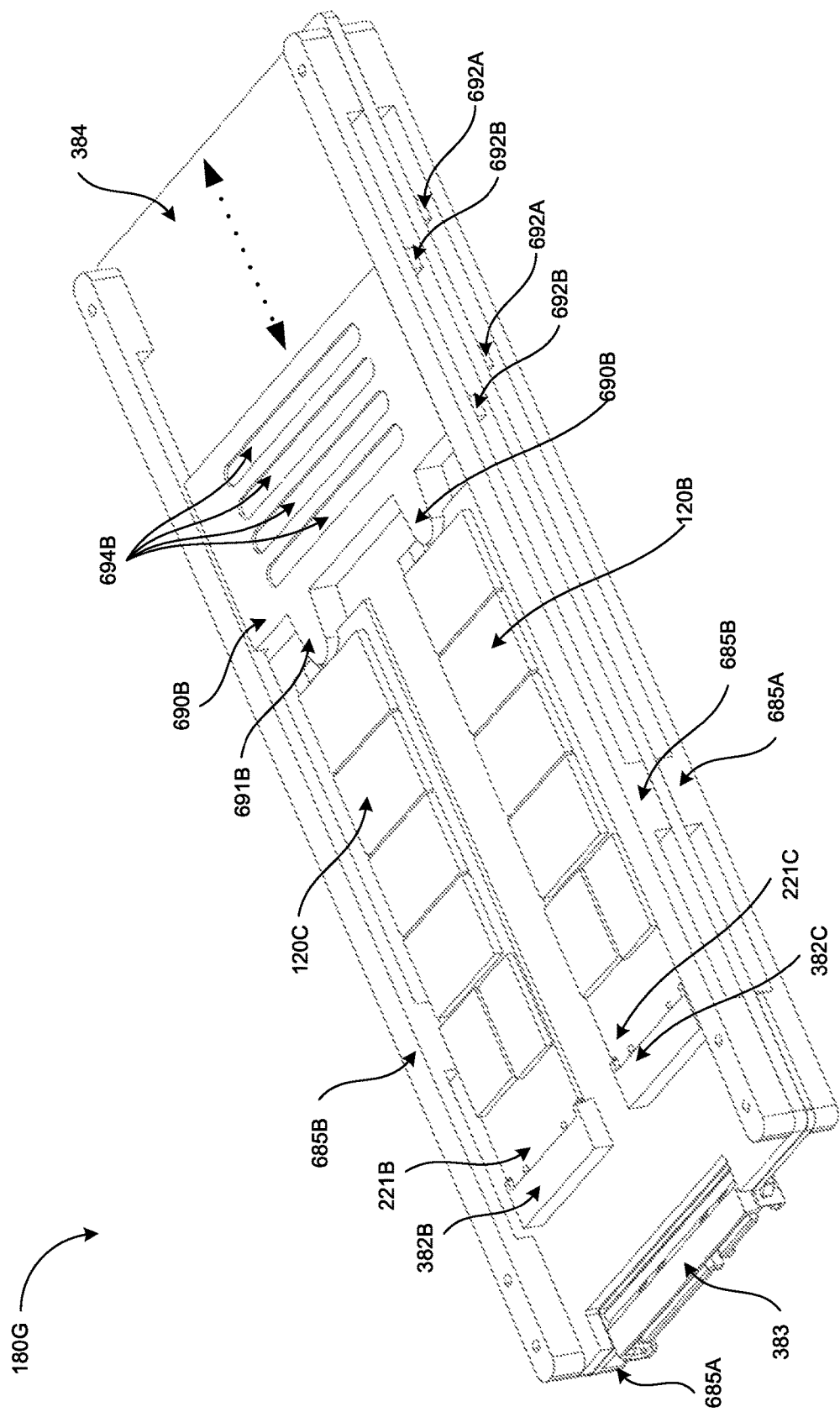

DATA STORAGE DEVICE ADAPTOR WITH SECUREMENT MECHANISM

BACKGROUND

Field of the Disclosure

This disclosure relates to a data storage device adaptor. More particularly, the disclosure relates to a data storage device adaptor that includes a securement mechanism.

Description of the Related Art

Data storage devices may be used to store data used by computing devices. The computing devices may execute applications, apps, services, processes, threads, etc., that may read, write, update, and/or access data that is stored on the data storage devices. For example, a computing device may store a file on a data storage device. In another example, a computing device may read files from a data storage device.

SUMMARY

In one embodiment, an apparatus is provided. The apparatus includes a printed circuit board. The apparatus also includes a first connector coupled to the printed circuit board. The first connector is configured to couple the apparatus to a computing device. The apparatus further includes a second connector coupled to the printed circuit board. The second connector is configured to couple the apparatus to a data storage device. The apparatus further includes a securement mechanism. The securement mechanism includes a first portion and a second portion. The securement mechanism is rotatable about a point on the apparatus between a first position and a second position. The first portion is configured to maintain the securement mechanism at the first position. The second portion is configured to secure the data storage device to the apparatus when the securement mechanism is in the first position.

In one embodiment, an apparatus is provided. The apparatus includes a printed circuit board. The apparatus also includes a first connector coupled to the printed circuit board. The first connector is configured to couple the apparatus to a computing device. The apparatus further includes a second connector coupled to the printed circuit board. The second connector is configured to couple the apparatus to a data storage device. The apparatus further includes a securement mechanism. The securement mechanism includes a first portion and a second portion. The securement mechanism is movable along a length of the apparatus between a first position and a second position. The first portion is configured to maintain the securement mechanism at the first position. The second portion is configured to secure the data storage device to the apparatus when the securement mechanism is in the first position.

In one embodiment, an apparatus is provided. The apparatus includes a printed circuit board. The apparatus also includes a first connector coupled to the printed circuit board. The first connector is configured to couple the apparatus to a computing device. The apparatus further includes a second connector coupled to the printed circuit board. The second connector is configured to couple the apparatus to a data storage device. The apparatus further includes a securement mechanism comprising a first portion and a second portion. The securement mechanism is movable about the apparatus between a first position and a second position. The first portion is configured to maintain the securement mechanism at the first position. The second portion is configured to secure the data storage device to the apparatus when the securement mechanism is in the first position.

BRIEF DESCRIPTION OF THE DRAWINGS

FIG. 9B illustrates a perspective view of an adaptor in accordance with one or more embodiments of the present disclosure.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
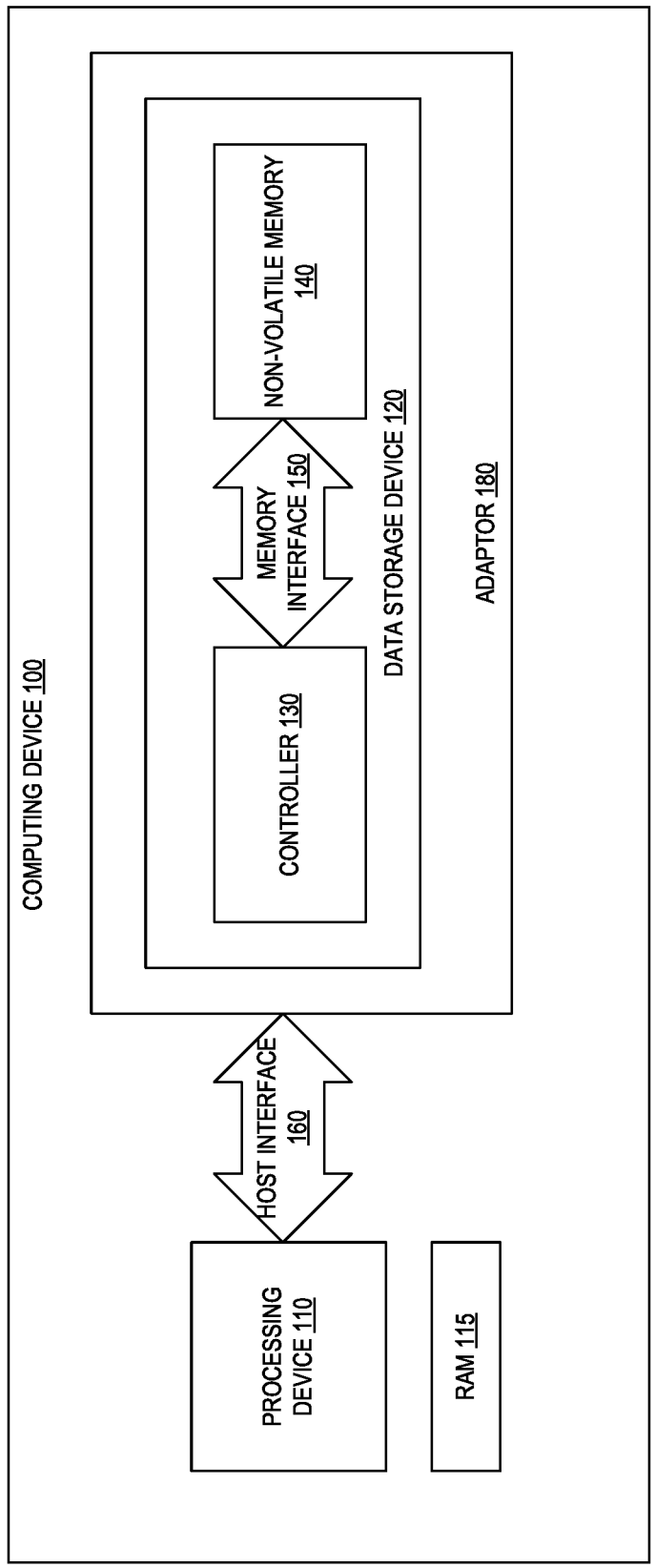
FIG. 1 is a block diagram illustrating an example computing device, in accordance with one or more embodiments of the present disclosure.

In the following disclosure, reference is made to examples, implementations, and/or embodiments of the disclosure. However, it should be understood that the disclosure is not limited to specific described examples, implementations, and/or embodiments. Any combination of the features, functions, operations, components, devices, parts, modules, etc., disclosed herein, whether related to different embodiments or not, may be used to implement and practice the disclosure. Furthermore, although embodiments of the disclosure may provide advantages and/or benefits over other possible solutions, whether or not a particular advantage and/or benefit is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in the claim(s).

The headings provided herein are for convenience only and do not necessarily affect the scope or meaning of the claimed invention. Disclosed herein are example implementations, configurations, and/or embodiments relating to encoding and/or decoding digital videos using controllers (e.g., processors, processing devices, etc.) of data storage devices.

Data storage devices, such as memory cards (e.g., secure digital (SD) cards), memory sticks (e.g., universal serial bus (USB) stick, thumb drives, etc.), solid state drives (SSDs), hard disk drives (HDDs), hybrid drives (e.g., storage drives/devices that include both magnetic media/medium and flash memory), etc., typically include one or more controllers coupled with one or more non-volatile memory (NVM) arrays. The controllers may execute commands (e.g., access commands, data access commands, etc.) to read, write, access, etc., data that may be stored in the one or more NVM arrays.

It may be useful to test the operations/functions of data storage devices at various points in time. For example, a data storage device may be tested during the manufacture of the data storage device. In another example, the data storage device may be tested after the data storage device is installed in a device (e.g., installed in a computer). The tests may determine the performance of the data storage device. For example, during the manufacturing process for data storage devices, it may be useful to test the performance of the data storage device to ensure that the data storage device performs as expected. A data storage device may be installed in an adaptor that allows the data storage device to be connected to a computing device and tested. For example, the adaptor may be inserted into the computing device and/or coupled to the computing device to test the data storage device. Installing the data storage device in the adaptor may take time and effort for the user. For example, conventional methods for securing data storage devices to an adaptor may use a screw. It may be more difficult and/or time consuming for users to attach the data storage device to the adaptor using a screw. This may increase the effort, time, and/or cost when testing the data storage device. For example, if a large number of data storage devices are tested (e.g., in a testing/manufacturing environment) a user (e.g., a tester) spends a minute screwing in and unscrewing a data storage device from an adaptor, this may decrease the number of data storage devices a user may testing during a period of time.

The embodiments, implementations, examples, etc., disclosed herein may allow a data storage device to be secured, installed, coupled to, etc., an adaptor more quickly. An adaptor may include a securement mechanism that allows a user to use a single motion and/or one hand to secure the data storage device to an adaptor. For example, the securement mechanism may be a latch that the user may rotate/swing into different positions. In another example, the securement mechanism may be a slider that the user may slide into different positions. The securement mechanism may avoid contact with other components (e.g., memory chips, flash chips, etc.) of the data storage device while securing the data storage device to the adaptor.

FIG. 1 is a diagram illustrating an example computing device 100, in accordance with some embodiments of the present disclosure. The computing device 100 includes a processing device 110, a random access memory (RAM) 115, and data storage device 120. The processing device 110 may be one or more devices that execute instructions (e.g., executes machine instructions, code, machine code, etc.). Examples of a processing device may include, but are not limited to a controller, a system-on-a-chip (SoC), a field-programmable gate array (FPGA), an application-specific integrated circuit (ASIC), a central processing unit (CPU), a processor, a multi-core processor, a graphics processing unit (GPU), etc. The RAM 115 may be a volatile memory that stores data that may be used by the processing device 110. A volatile memory may be a memory (or other device that stores data and allows access to the data) that does not retain the data when power is not provided to the volatile memory (e.g., when power is turned off).

The computing device 100 may be a device that may execute services, processes, applications, apps, instructions, etc., to perform one or more operations. Examples of computing devices include, but are not limited to, phones (e.g., smart phones, cellular phones, etc.), cable set-top boxes, smart televisions (TVs), video game consoles, laptop computers, tablet computers, desktop computers, server computers, personal digital assistances, wearable devices (e.g., smart watches), media players, cameras, and/or other types of electronic devices. The computing device may also be referred to as a host system. The computing device 100 may be coupled to one or more networks and/or other computing devices via the one or more networks (E.g., a local area network, a wide area network, a wired network, a wireless network a cellular network, etc.).

The computing device 100 may include an adaptor 180. The adaptor 180 may allow the data storage device 120 to conform to (e.g., fit within) other form factors or standards. For example, the adaptor 180 may allow a device that has an M.2 form factor to be used in a slot that conforms to a 2.5-inch drive form factor. The adaptor 180 may also allow the data storage device 120 to be coupled to a type of connector that is different than the type of the connector used by the data storage device 120. For example, the adaptor 180 may allow the data storage device 120 (which may include a first type of connector, such as an NVMe connector) to be coupled to the computing device 100 via another type of connector (e.g., a SATA connector). In some embodiments, the adaptor 180 may be separate from and/or external to the computing device 100.

The data storage device 120 may be any type of data storage device, drive, module, component, system, or the like. Furthermore, the terms "card," "memory card," "drive," "flash drive," "memory stick," "storage drive,"

"hard drive" and "data storage drive" may be used herein in certain contexts to refer to any type of data storage device, and may be used substantially interchangeably with the term "data storage device" herein in connection with various embodiments and/or in various contexts. As shown, the data storage device 120 (e.g., hybrid hard drive, solid-state drive, a memory card, any storage device utilizing solid-state memory, a hard disk drive, any storage device utilizing magnetic media/medium, etc.) includes a controller 130 (e.g., control circuitry, software, firmware, or a combination thereof) and a non-volatile memory 140. For example, the data storage device 120 may be a secure digital (SD) card, a miniSD card, a microSD card, a compact flash (CF) card, a multimedia card (MMC), an eXtreme digital (xD) card, etc.

The non-volatile memory (NVM) 140 may be configured for long-term storage of data and may retain data between power on/off cycles of the data storage device 120. The non-volatile memory 140 and/or portions of the non-volatile memory 140 may also be referred to as a storage medium. In some embodiments, the non-volatile memory 140 may include solid-state memory. Solid-state memory may comprise a wide variety of technologies, such as flash integrated circuits, Phase Change Memory (PC-RAM or PRAM), Programmable Metallization Cell RAM (PMC-RAM or PMCm), Ovonic Unified Memory (OUM), Resistance RAM (RRAM), NAND memory (e.g., single-level cell (SLC) memory, multi-level cell (MLC) memory, triple level cell memory, X4 cell memory, etc.), NOR memory, EEPROM, Ferroelectric Memory (FeRAM), magnetoresistive RAM (MRAM), or other discrete solid-state memory chips.

In other embodiments, the non-volatile memory 140 may include magnetic media (including shingle magnetic recording), optical disks, floppy disks, electrically programmable read only memories (EPROM), electrically erasable programmable read only memories (EEPROM), etc. Non-volatile memory that uses magnetic media/medium may include one or more magnetic platters. Each platter may contain one or more regions of one or more tracks of data. The non-volatile memory 140 may include any combination of the one or more types of memories described here. The non-volatile memory 140 may be divided logically and/or physically into cells, dies, arrays, planes, blocks, pages, tracks, and sectors.

The controller 130 may include one or more processors, memory devices, data and/or power transmission channels/paths, boards, or the like. In some embodiments, the controller 130 may be implemented as one or more system-on-a-chip (SoC) modules, field-programmable gate array (FPGA) modules, application-specific integrated circuit (ASIC) modules, processing devices (e.g., processors), chips, or the like. In other embodiments, one or more components of the controller 130 may be mounted on a printed circuit board (PCB). The controller 130 may be configured to receive data commands from a storage interface (e.g., a device driver) residing on the computing device 100.

The controller 130 may communicate with the computing device 100 over a host interface 160, and may receive commands via the host interface 160. A host interface 160 may be hardware, software, and/or a combination thereof that allows the processing device to communicate with the data storage device 120. Examples of host interfaces include, but are not limited to, peripheral component interconnect express (PCIe), serial AT attachment (SATA), serial attached small computer system interface (SAS), non-volatile memory express (NVMe), etc. These commands may be referred to as data commands, data access commands, data storage access commands, etc. Data commands may specify a block address in the data storage device 120. Data may be accessed/transferred based on such data commands. For example, the controller 130 may receive data commands (from the computing device 100) and may execute such commands on/in the non-volatile memory 140 (e.g., in one or more arrays, pages, blocks, sectors, etc.). The data commands received from computing device 100 may include read data commands, write data commands, and erase data commands. The controller 130 may be coupled to the non-volatile memory (NVM) 140 via a memory interface 150. In one embodiment, the memory interface 150 may include a plurality of channels (e.g., one or more lines, pines, wires, traces, etc.) and each channel may be coupled to different portions of the non-volatile memory 140 (e.g., different NVM arrays, different flash arrays, etc.).

The controller 130 may include an encoder and/or decoder (not illustrated in the figures) to encode and/or decode data. The encoder may encode data when storing the data on the non-volatile memory 140. The encoder may encode the data to protect the data from errors, loss, corruption, etc. For example, the encoder may use parity bits, error correction codes, codewords, etc. The decoder may decode data and/or perform error correction on the data that is stored on the non-volatile memory 140 (e.g., may decode codewords).

The data storage device 120 may store data received from the computing device 100 such that the data storage device 120 acts as data storage for the computing device 100. To facilitate this function, the controller 130 may implement a logical interface. The logical interface may present to the computing device memory as a set of logical addresses (e.g., sequential/contiguous addresses) where data may be stored. Internally, the controller 130 may map logical addresses to various physical memory addresses in the non-volatile memory arrays 141 and/or other memory module(s).

As discussed above, it may be useful to test the operations/functions of data storage devices at various points in time (e.g., during the manufacture of data storage devices). The tests may determine the performance of the data storage device. A data storage device may be installed in an adaptor that allows the data storage device to be connected to a computing device and tested. Decreasing the amount of time for a user to attach, install, secure, etc., a data storage device to an adaptor may allow the data storage devices to be tested more quickly, efficiently, and/or may save costs. It may also be useful to provide an adaptor to enable various form factors of data storage devices to be installed in storage and/or computing systems with slots that do not conform to the storage devices' dimensions.

Figure 2A:
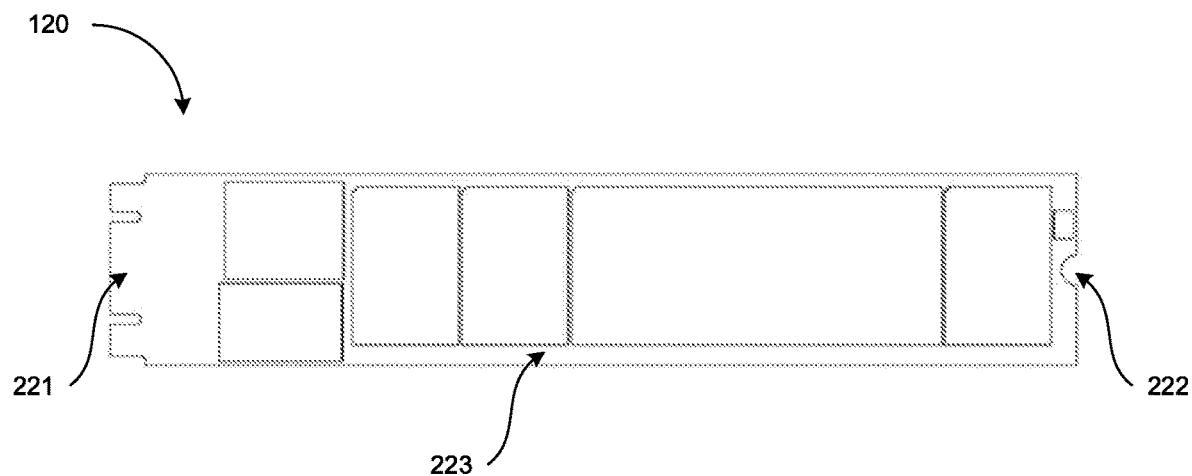
FIG. 2A illustrates an example data storage device in accordance with one or more embodiments of the present disclosure.

FIG. 2A illustrates an example data storage device 120 in accordance with one or more embodiments of the present disclosure. As discussed above, the data storage device 120 (e.g., a solid-state drive, a storage device utilizing solid-state memory, etc.) includes a controller 130 (e.g., control circuitry, software, firmware, or a combination thereof) coupled to a non-volatile memory (e.g., flash memory, solid-state memory, etc.) via a memory interface. The non-volatile memory may be configured for long-term storage of data and may retain data between power on/off cycles of the data storage device 120. The controller may include one or more processors, memory devices, data and/or power transmission channels/paths, boards, or the like. The controller may communicate with the computing device over a host interface, and may receive commands via the host interface. These commands may be referred to as data commands, data access commands, data storage access commands, etc. Data may be accessed/transferred based on such data commands (e.g., data may be read, written, erased, etc.). The controller may also include an encoder and/or a decoder for encoding and/or decoding data, as discussed above.

As illustrated in FIG. 2A, the data storage device 120 may include a connector 221. The connector 221 may allow the data storage device 120 to be coupled to another device (e.g., a computing device, a motherboard, an adaptor, etc.). The connector 221 may be coupled to a corresponding connector on other device. For example, the connector 221 may be a male connector which is inserted into a corresponding female connector on the other device. In one embodiment, the connector may be a non-volatile memory express (NVMe) connector. Although the present disclosure may refer to NVMe connectors, other types of connectors may be used in the data storage device 120 in other embodiments.

Also as illustrated in FIG. 2A, the data storage device 120 may include a retention feature 222. The retention feature 222 may be a portion of the data storage device 120 that may come into contact with another component (e.g., a screw, a bolt, etc.) to prevent the data storage device 120 from moving. The retention feature 222 may be used to retain, secure, mount, install, etc., the data storage device 120 to another device. The retention feature 222 may include a notch, cutout, a groove, an indent, etc., in a printed circuit board (PCB) of the data storage device. The retention feature 222 may also include the area around the notch which may come into contact with a securing component or mechanism (e.g., a screw, a tab, etc.) as discussed in more detail below. For example, a screw may be inserted through the notch to secure the data storage device 120 to the printed circuit board of another device.

In one embodiment, the data storage device 120 may have an M.2 form factor and/or may conform to the M.2 standard. The M.2 standard may specify the dimensions of the data storage device 120 and/or components of the data storage device. For example, the M.2 standard may indicate the length (e.g., 16 millimeters (mm), 26 mm, 30 mm, 38 mm, 42 mm, 60 mm, 80 mm, 110 mm, or some other appropriate length) and/or width (e.g., 12 mm, 16 mm, 22 mm, 30 mm, or some other appropriate width). The M.2 standard may also indicate the types of connectors and/or locations of connectors for the data storage device 120. The M.2 standard may further specify the locations, and/or dimensions of components of the data storage device 120. For example, the M.2 standard may specify the thickness of a printed circuit board 223 of the data storage device 120. In another example, the M.2 standard may specify the location and/or dimensions of components located on the printed circuit board 223 (e.g., flash memory chips, a controller, a processing device, etc.). Although the present disclosure may refer to the M.2 standard and/or form factor, other types of data storage devices which conform to other standards and/or form factors may be used in other embodiments.

Figure 2B:
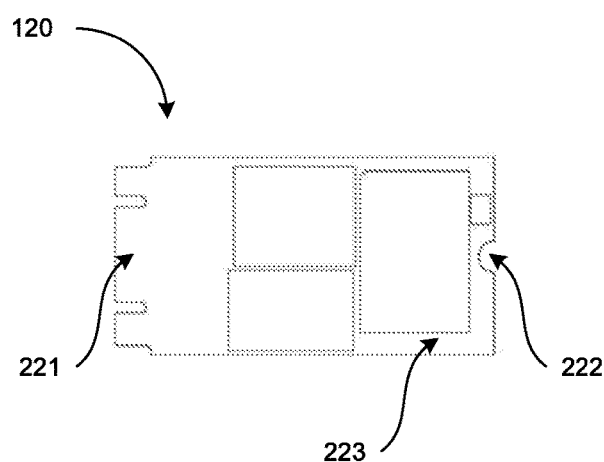
FIG. 2B illustrates an example data storage device in accordance with one or more embodiments of the present disclosure.

FIG. 2B illustrates an example data storage device 120 in accordance with one or more embodiments of the present disclosure. As discussed above, the data storage device 120 includes a controller 130 coupled to a non-volatile memory via a memory interface. The non-volatile memory may be configured for long-term storage of data and may retain data between power on/off cycles of the data storage device 120. The controller may communicate with the computing device over a host interface, and may receive commands via the host interface. Data may be accessed/transferred based on such data commands (e.g., data may be read, written, erased, etc.). The data storage device 120 may store data received from the computing device 100 such that the data storage device 120 acts as data storage for the computing device 100.

As illustrated in FIG. 2B, the data storage device 120 may include a connector 221 which may allow the data storage device 120 to be coupled to another device. The connector 221 may be coupled to a corresponding connector on other device. In one embodiment, the connector may be a non-volatile memory express (NVME) connector. Also as illustrated in FIG. 2B, the data storage device 120 may include a retention feature 222. The retention feature 222 may include a notch, cutout, a groove, an indent, etc., in a printed circuit board (PCB) of the data storage device. As discussed above, the data storage device 120 may have or conform to an M.2 form factor and/or standard.

Figure 3A:
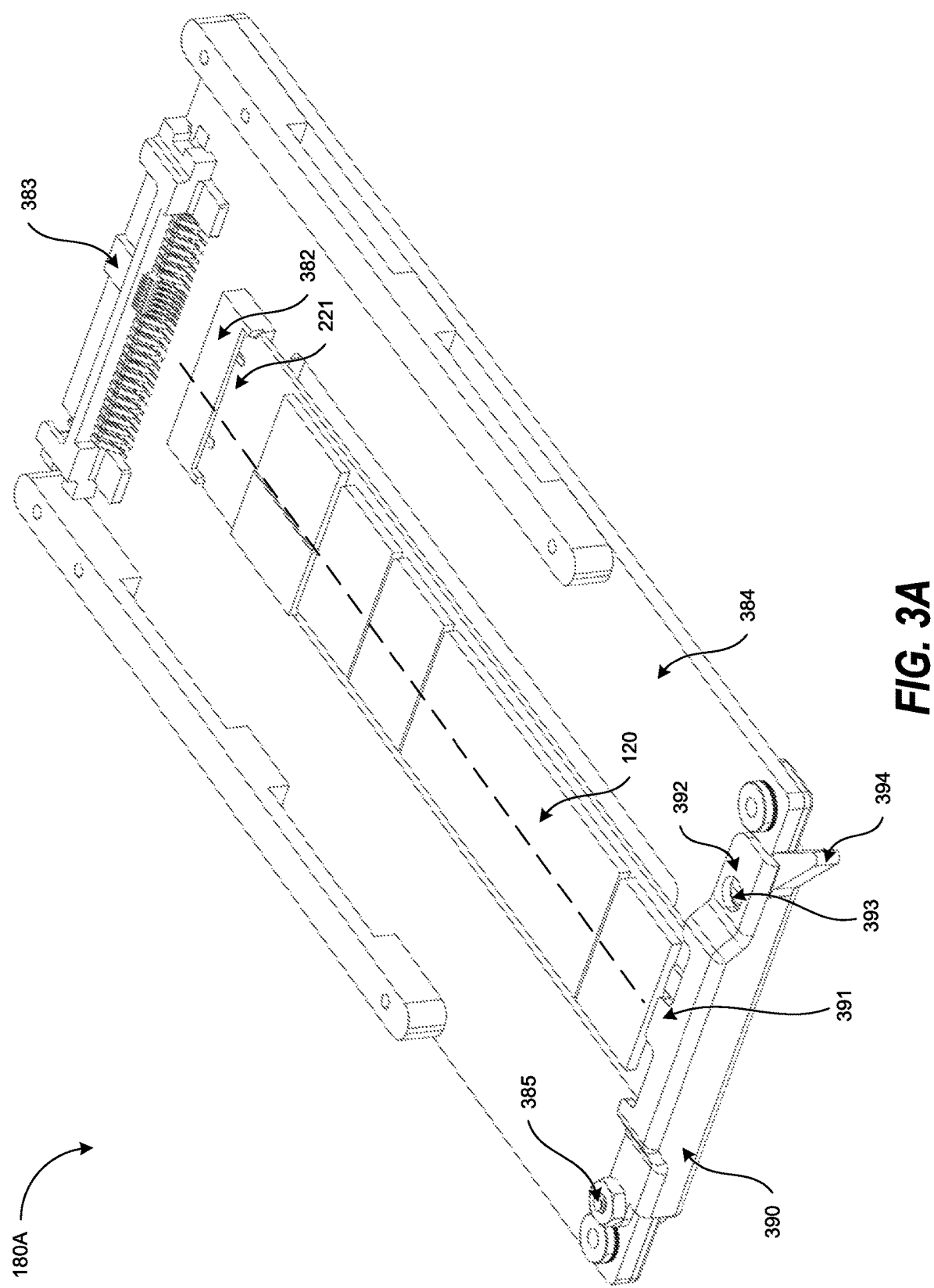
FIG. 3A illustrates a perspective view of an adaptor in accordance with one or more embodiments of the present disclosure.

FIG. 3A illustrates a perspective view of an adaptor 180A in accordance with one or more embodiments of the present disclosure. The adaptor 180A includes a securement mechanism 390, a printed circuit board 384, a connector 382, and a connector 383. As illustrated and without limitation, the securement mechanism 390 may be generally disposed, coupled or otherwise attached at a proximal end or edge with respect to the adaptor 180A. The connector 382 and the connector 383 may each be coupled to the printed circuit board 384. The adaptor 180A may allow the data storage device 120 to conform to (e.g., fit within) other form factors or standards. For example, the adaptor 180A may allow a device that has an M.2 form factor to be used in a slot that conforms to a 2.5-inch drive form factor. The adaptor 180A may also allow the data storage device 120 to be coupled to a type of connector that is different than the type of the connector 221 used by the data storage device 120. For example, the adaptor 180A may allow the data storage device 120 (which may include a first type of connector, such as an NVME connector) to be coupled to a computing device via another type of connector (e.g., a SATA connector).

A data storage device 120 (e.g., a flash drive, a solid state drive, a M.2 drive, etc.) may be coupled to the adaptor 180A (e.g., an apparatus) via the connector 382. The connector 382. The connector 383 may allow the adaptor 180A (and the data storage device 120) to be coupled to another device (e.g., a computing device, a computer, etc.). For example, the connector 383 may be a SATA connector (e.g., a male SATA connector or some other type of connector) that allows the adaptor 180A to be coupled to another SATA connector in the other device. The connector 382 and the connector 383 may be coupled to each other. For example, pins, wires, traces, etc., may couple the connector 382 to the connector 383. This may allow data and/or power to be transmitted between the connector 382 and the connector 383.

The securement mechanism 390 is attached to the adaptor 180A at point 385 (e.g., a location) on the adaptor 180A. For example, the securement mechanism 390 may be attached to the adaptor via screws, nuts, bolts, etc., at point 385. The securement mechanism 390 may be rotatable (e.g., movable) to various positions, about the point 385. For example, the securement mechanism 390 may be rotated around the point 385 to various positions, as discussed in more detail below. As illustrated in FIG. 3A, the point 385 is offset from an axis of the data storage device 120 (e.g., the axis illustrated by the dashed line). For example, the point 385 is not located along (e.g., is offset from) the longitudinal axis of the data storage device 120 (e.g., the center axis along the length of the data storage device 120).

In one embodiment, the securement mechanism 390 be in a first position, as illustrated in FIG. 3A. In the first position, the securement mechanism 390 may secure the data storage device 120 to the adaptor 180A. The data storage device 120 may be irremovable from the adaptor 180A when the securement mechanism 390 is in the first position illustrated in FIG. 3A. For example, the securement mechanism 390 may prevent the data storage device 120 from being removed, uncoupled, etc., from the adaptor 180A (e.g., may prevent the data storage device 120 from being removed without damaging the data storage device 120) when the securement mechanism is in the first position. The first position may be referred to as a closed position, a secure position, a locked position, etc.

The securement mechanism 390 includes a protrusion 391. In one embodiment, the protrusion 391 may secure (or help secure) the data storage device 120 to the adaptor 180A when the securement mechanism 390 is in the first position (e.g., the closed positioned). The protrusion 391 may be a tab, or similar abutment, etc., that may interact with a retention feature of the data storage device 120 (e.g., retention feature 222 illustrated in FIGS. 2A and 2B). For example, the protrusion 391 may interact with (e.g., touch, contact, abut, push against, etc.) the retention feature of the data storage device 120. This may prevent the data storage device 120 from being moved, adjusted, removed, repositioned, etc. For example, the protrusion 391 may keep the data storage device 120 from being pulled out of the connector 382, from being lifted, etc. The protrusion 391 may allow the securement mechanism 390 to secure the data storage device 120 to the adaptor 180A without touching other components of the data storage device (e.g., without touching flash ships, a controller, wires, pins, etc.).

The securement mechanism 390 includes a ledge 392. In one embodiment, the ledge 392 may maintain (or help maintain) the securement mechanism 390 in the first position (e.g., in the closed position). For example, the ledge 392 may include one or more aperture(s) 393 (e.g., one on the a first/upper/top side of the securement mechanism 390 and one of the second/lower/bottom side of the securement mechanism 390). The aperture(s) 393 may interact with one or more features (e.g., locking features) of the adaptor 180A to maintain the securement mechanism 390 in the first position (e.g., to prevent the securement mechanism 390 from moving). For example, one or more tabs (e.g., protrusions, bumps, etc.) on the adaptor 180A may temporarily deform to allow the one or more tabs to be inserted into the aperture(s) 393. After the one or more tabs are inserted into the aperture(s) 393, the tabs may reform (e.g., go back to their original shape). The one or more tabs may help prevent the securement mechanism 390 from moving out of the first position (e.g., from moving out of the closed position) by touching, pushing against, touching, interacting with, interface with, etc., the walls of the aperture(s) 393.

In one embodiment, the securement mechanism 390 also includes a tab 394. The tab 394 may assist a user in moving the securement mechanism 390 into different positions. For example, the tab 394 may provide a surface for a user to apply pressure or force (e.g., using the user's thumb) to push the securement mechanism 390 into the first position.

In one embodiment, the securement mechanism 390 may allow the data storage device 120 to be secured, installed, coupled to, etc., an adaptor more quickly and/or easily. For example, the engagement 394 and the latch configuration of the securement mechanism 390 may allow the securement mechanism 390 to be quickly and/or easily rotated into the closed or locked position. The engagement 394 also allows a user to secure the data storage device 120 to the adaptor 180A with one hand. The protrusion 391 allows the securement mechanism to secure the data storage device 120 in the adaptor 180A while avoiding contact with other components (e.g., memory chips, flash chips, etc.) of the data storage device 120.

Figure 3B:
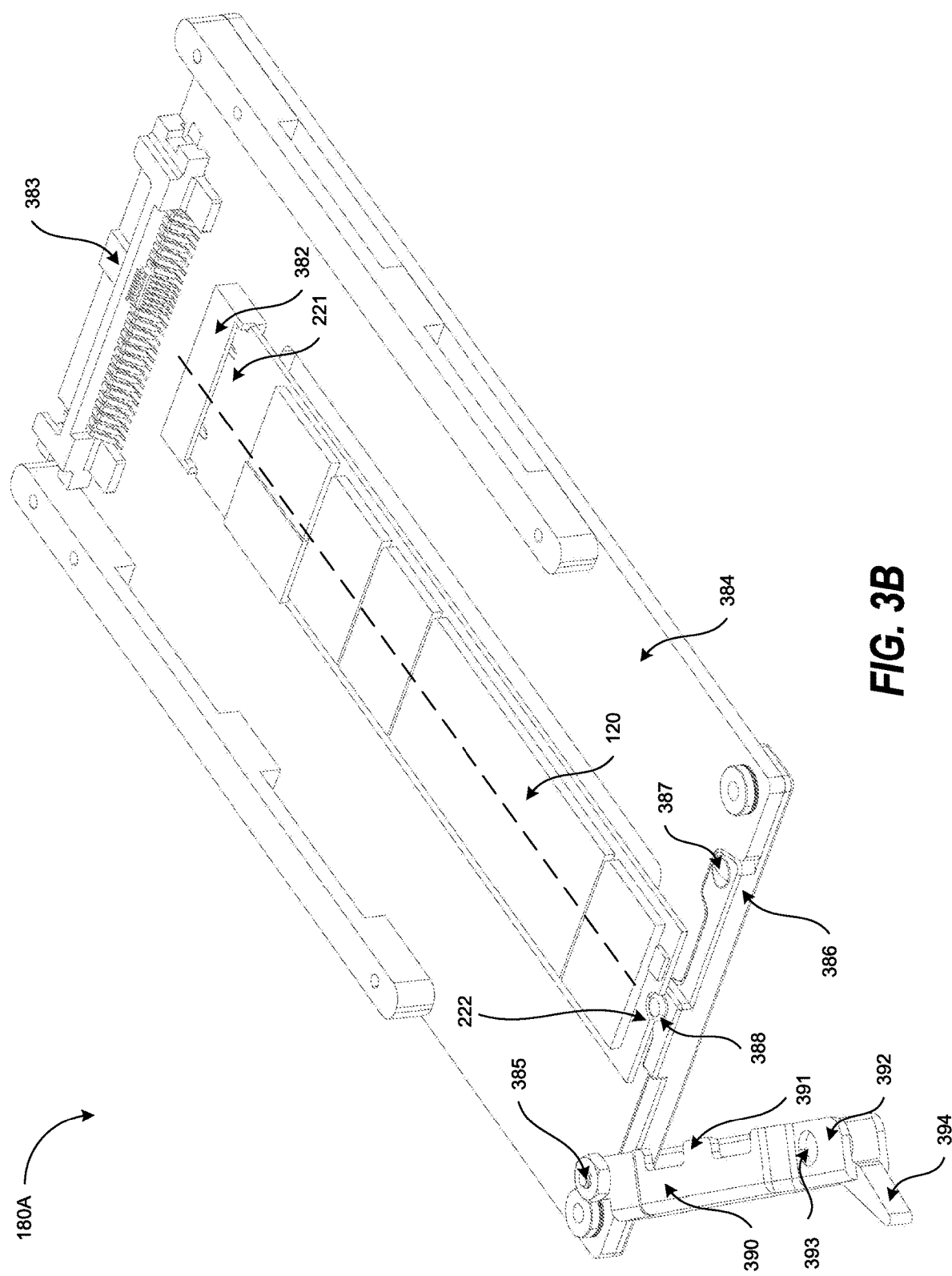
FIG. 3B illustrates a perspective view of an adaptor in accordance with one or more embodiments of the present disclosure.

FIG. 3B illustrates a perspective view of an adaptor in accordance with one or more embodiments of the present disclosure. The adaptor 180A includes a securement mechanism 390, a printed circuit board 384, a connector 382, and a connector 383. The connector 382 and the connector 383 may be coupled to the printed circuit board 384. A data storage device 120 may be coupled to the adaptor 180A via the connector 382. The connector 383 may allow the adaptor 180A (and the data storage device 120) to be coupled to another device (e.g., a computing device, a computer, etc.). The connector 382 and the connector 383 may be coupled to each other via pins, wires, traces, etc. This may allow data and/or power to be transmitted between the connector 382 and the connector 383. The securement mechanism 390 is attached to the adaptor 180A at point 385. The securement mechanism 390 may be rotatable (e.g., movable) to various positions, about the point 385. As illustrated in FIG. 3B, the point 385 is offset from an axis of the data storage device 120 (e.g., the axis illustrated by the dashed line).

In one embodiment, the securement mechanism 390 be in a second position, as illustrated in FIG. 3B. In the second position, the securement mechanism 390 may allow the data storage device 120 to be removed from the adaptor 180A. For example, the data storage device 120 may be removable from the adaptor 180A when the securement mechanism 390 is in the first position illustrated in FIG. 3B. The second may be referred to as an open position, a free position, an accessible position, etc.

The securement mechanism 390 includes a protrusion 391. As discussed above, the protrusion 391 (e.g., a tab, abutment, etc.) may secure (or help secure) the data storage device 120 to the adaptor 180A when the securement mechanism 390 is in the first position (e.g., the closed positioned). In the second position (illustrated in FIG. 3B), the protrusion 391 may not interact with (e.g., may not touch, contact, abut, push against, etc.) the retention feature 222 of the data storage device 120. This may allow the data storage device 120 to be moved, adjusted, removed, repositioned, etc. For example, because the protrusion 391 is not in contact with the retention feature 222 of the data storage device 120, the protrusion 391 may not prevent the data storage device 120 from being moved, removed, etc.

The securement mechanism 390 includes a ledge 392. The ledge 392 may include one or more aperture(s) 393. The aperture(s) 393 may interact with one or more features 387 of the adaptor 180A to maintain the securement mechanism 390 in the first position (e.g., to prevent the securement mechanism 390 from moving), as discussed above.

In one embodiment, the features 387 may be part of component 386 that is coupled to the adaptor 180A (e.g., that screwed onto, attached to, etc., the adaptor 180A). For example, the component 386 may be a layer, strip, bar, segment, etc., that is attached to the printed circuit board 384 of the adaptor 180A. The component 386 may also include a guiding feature 388 (e.g., a tab, a protrusion, a bump, etc.) that may allow a user to align the data storage device 120 when the data storage device 120 is coupled to the connector 382. For example, the guiding feature 388 (e.g., the tab) may fit within the gap of retention feature 222 to properly align the data storage device 120.

Figure 3C:
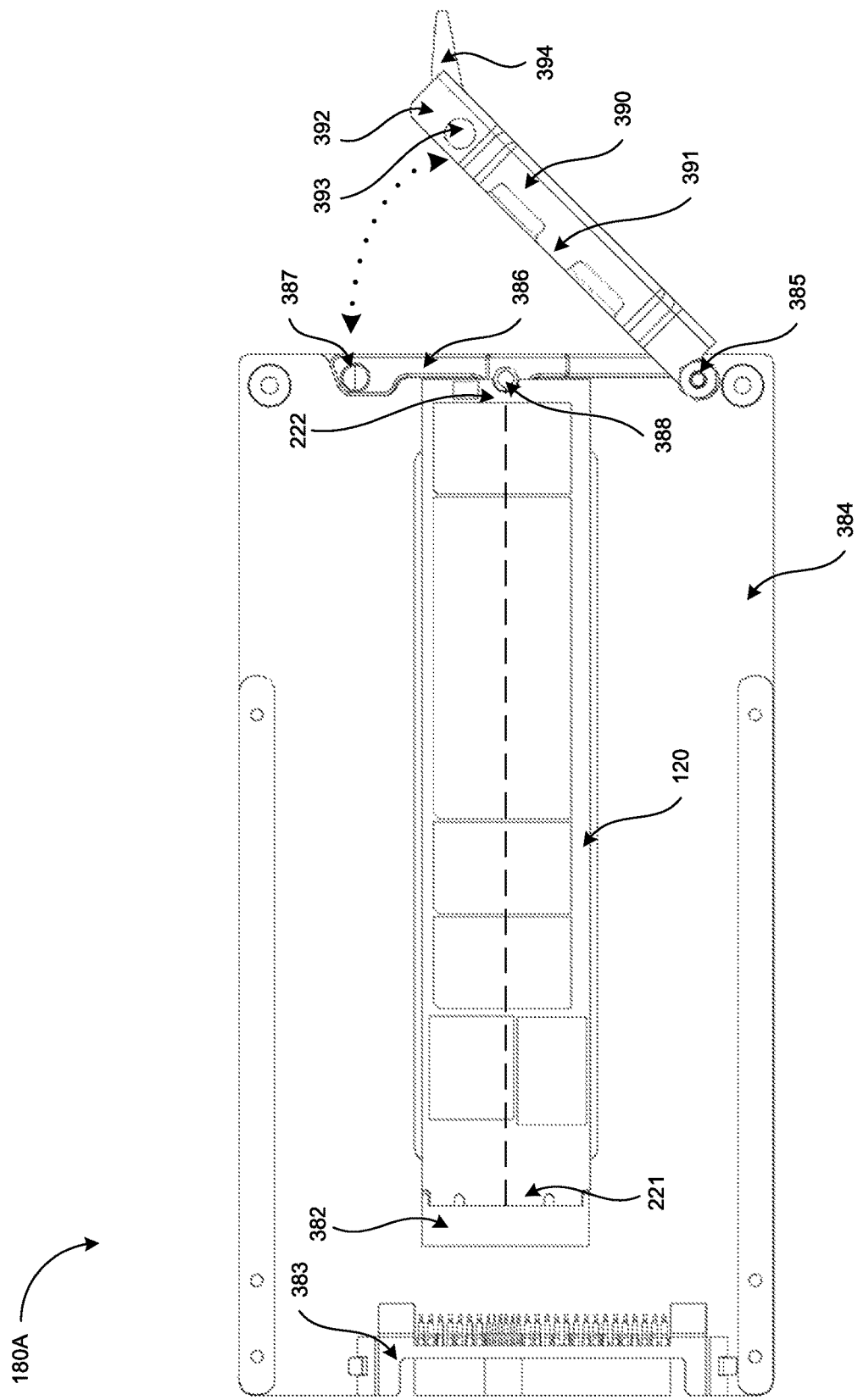
FIG. 3C illustrates a top view of an adaptor in accordance with one or more embodiments of the present disclosure.

FIG. 3C illustrates a top view of an adaptor 180A in accordance with one or more embodiments of the present disclosure. The adaptor 180A includes a securement mechanism 390, a printed circuit board 384, a connector 382, and a connector 383. A data storage device 120 may be coupled to the adaptor 180A via the connector 382. The securement mechanism 390 is attached to the adaptor 180A at point 385 on the adaptor 180A. The securement mechanism 390 may be rotatable to various positions, about the point 385, as illustrated by the dotted arrow.

In one embodiment, the securement mechanism 390 be in a second position, as illustrated in FIG. 3C. In the second position, the securement mechanism 390 may allow the data storage device 120 to be removed from the adaptor 180A. The securement mechanism 390 includes a protrusion 391. In the second position, the protrusion 391 may not interact with the retention feature 222 of the data storage device 120. This may allow the data storage device 120 to be moved, adjusted, removed, repositioned, etc. The securement mechanism 390 also includes a ledge 392. The ledge 392 may include one or more aperture(s) 393 that may interact with one or more features 387 of the adaptor 180A to maintain the securement mechanism 390 in the first position, as discussed above. The features 387 may be part of component 386 that is coupled to the adaptor 180A. The component 386 may also include a guiding feature 388 that may allow a user to align the data storage device 120 when the data storage device 120 is coupled to the connector 382.

Figure 4A:
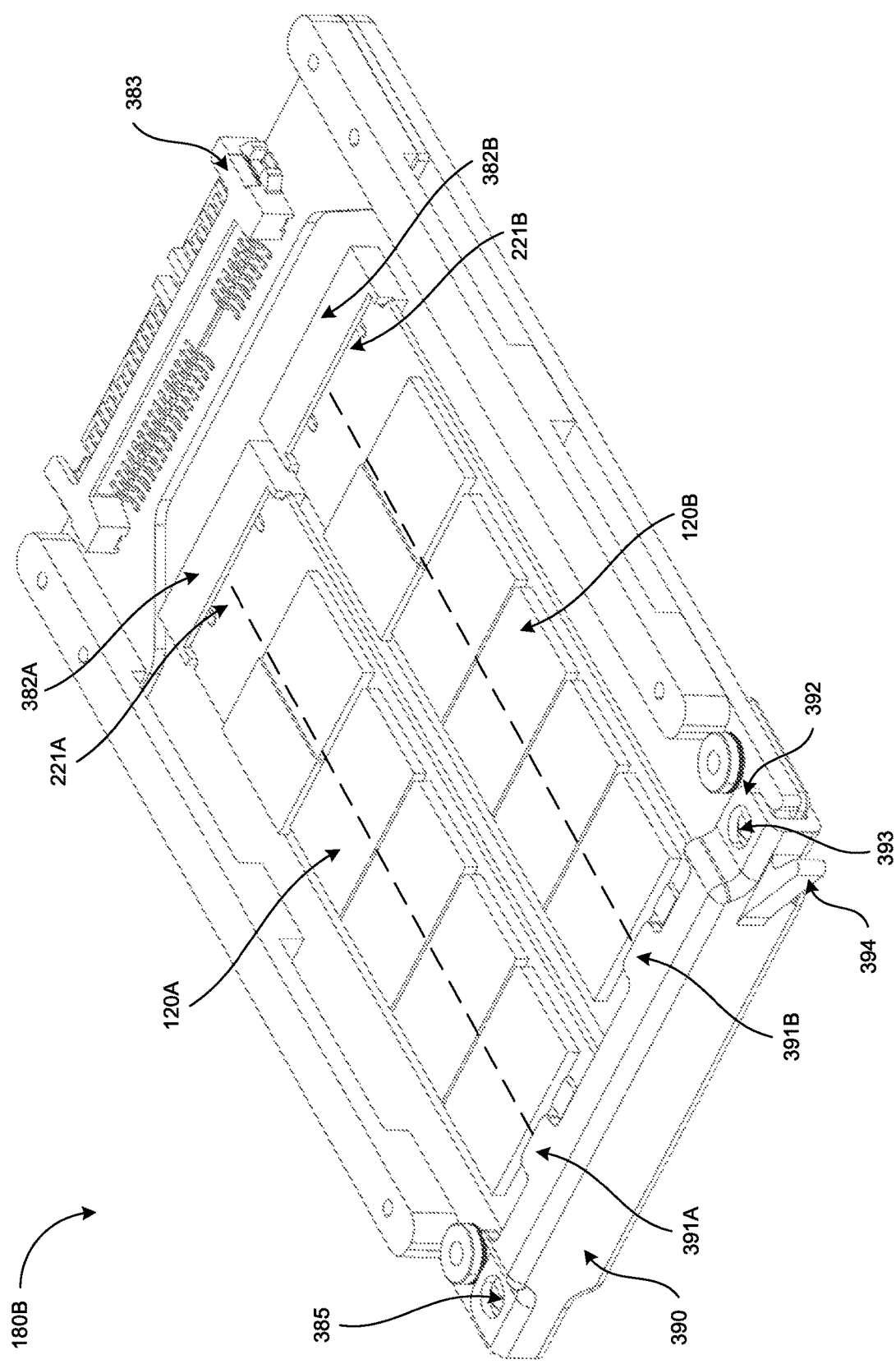
FIG. 4A illustrates a perspective view of an adaptor in accordance with one or more embodiments of the present disclosure.

FIG. 4A illustrates a perspective view of an adaptor 180B in accordance with one or more embodiments of the present disclosure. The adaptor 180B includes a securement mechanism 390, a printed circuit board 384, a connector 382A, a connector 382B, and a connector 383. The adaptor 180B also includes connectors 382C and 382D, as discussed in more detail below. The data storage device 120A may be coupled to the adaptor 180B via the connector 382A. The data storage device 120B may be coupled to the adaptor 180B via the connector 382B. The data storage devices 120A and 120B may be located on a same side of the adaptor 180B (e.g., a top, upper, or first side). The securement mechanism 390 is attached to the adaptor 180B at point 385 on the adaptor 180B. The securement mechanism 390 may be rotatable to various positions. As illustrated in FIG. 4A, the point 385 is offset from the axes of the data storage devices 120A and 120B (indicated by the dashed lines).

In one embodiment, the securement mechanism 390 be in a first position (e.g., a closed position), as illustrated in FIG. 4A. In the first position, the securement mechanism 390 may prevent the data storage device 120 from being removed from the adaptor 180B. The securement mechanism 390 includes protrusions 391A and 391B. Additional protrusions 391C and 391D (not illustrated in FIG. 4A) are discussed in more detail below. The protrusion 391A may secure (or help secure) the data storage device 120A to the adaptor 180B when the securement mechanism 390 is in the first position. The protrusion 391B may secure (or help secure) the data storage device 120B to the adaptor 180B when the securement mechanism 390 is in the first position. In the first position, the protrusions 391A and 391B may interact with the retention features of the data storage devices 120A and 120B. This may prevent the data storage device 120 from being moved, adjusted, removed, repositioned, etc. The securement mechanism 390 also includes a ledge 392. The ledge 392 may include one or more aperture(s) 393 that may interact with one or more features of the adaptor 180B to maintain the securement mechanism 390 in the first position, as discussed above.

Figure 4B:
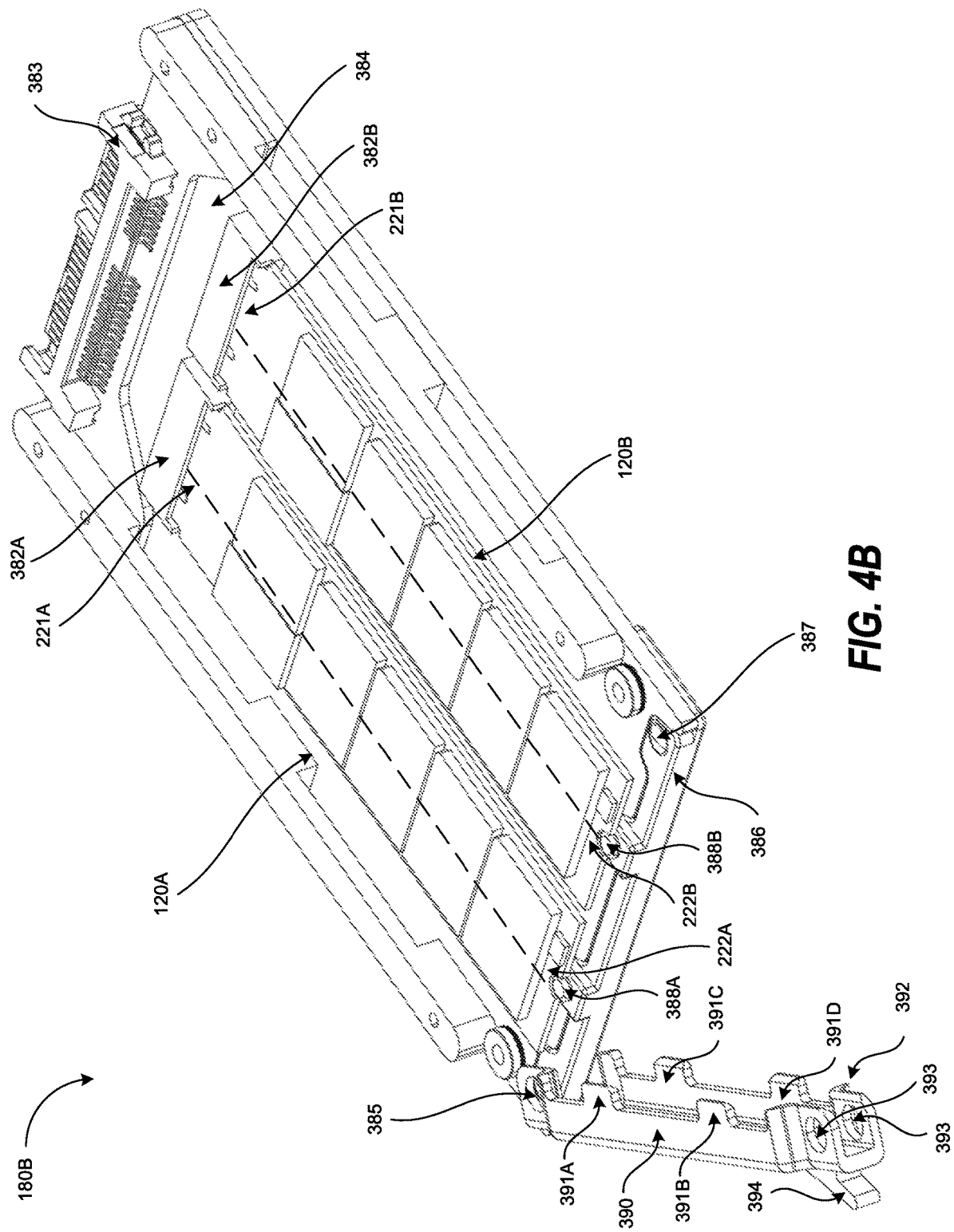
FIG. 4B illustrates a perspective view of an adaptor in accordance with one or more embodiments of the present disclosure.

FIG. 4B illustrates a perspective view of an adaptor in accordance with one or more embodiments of the present disclosure. The adaptor 180B includes a securement mechanism 390, a printed circuit board 384, a connector 382A, a connector 382B, and a connector 383. The adaptor 180B also includes connectors 382C and 382D, as discussed in more detail below.

In one embodiment, the securement mechanism 390 be in a second position (e.g., an open position), as illustrated in FIG. 4B. In the second position, the securement mechanism 390 may allow the data storage devices 120A and 120B to be removed from the adaptor 180B. The securement mechanism 390 also includes a ledge 392. The ledge 392 may include one or more aperture(s) 393 that may interact with one or more features 387 of the adaptor 180B to maintain the securement mechanism 390 in the first position, as discussed above. The features 387 may be part of component 386 that is coupled to the adaptor 180B. The component 386 may also include guiding features 388A and 388B that may allow a user to align the data storage devices 120A and 120B when the data storage devices 120A and 120B are coupled to the connectors 382A and 382B.

Figure 4C:
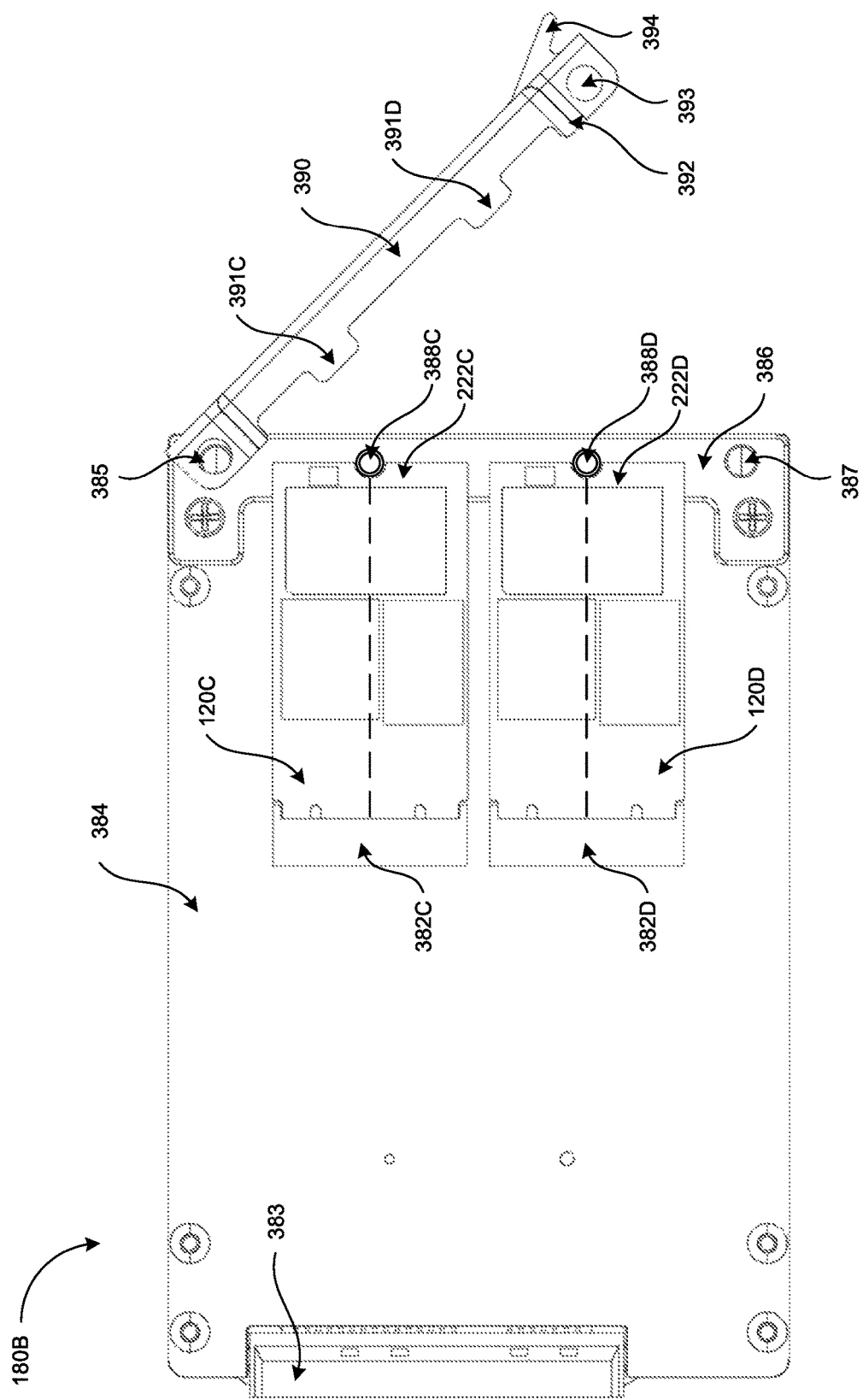
FIG. 4C illustrates a bottom view of an adaptor in accordance with one or more embodiments of the present disclosure.

FIG. 4C illustrates a bottom view of an adaptor 180B in accordance with one or more embodiments of the present disclosure. The adaptor 180B includes a securement mechanism 390, a printed circuit board 384, a connector 382A, a connector 382B, and a connector 383. The data storage device 120C may be coupled to the adaptor 180B via the connector 382C. The data storage device 120D may be coupled to the adaptor 180B via the connector 382D. The data storage devices 120C and 120D may be located on a same side of the adaptor 180B (e.g., the bottom, lower, second side). The securement mechanism 390 is attached to the adaptor 180B at point 385 on the adaptor 180B. As illustrated in FIG. 4A, the point 385 is offset from the axes of the data storage devices 120C and 120D (indicated by the dashed lines).

In one embodiment, the securement mechanism 390 be in a second position (e.g., an open position), as illustrated in FIG. 4C. In the second position, the securement mechanism 390 may allow the data storage devices 120C and 120D to be removed from the adaptor 180B. The securement mechanism 390 includes protrusions 391A, 391B, 391C and 391D, as discussed above. The protrusion 391C may secure (or help secure) data storage device 120C to the adaptor 180B when the securement mechanism 390 is in the first position. The protrusion 391D may secure (or help secure) data storage device 120D to the adaptor 180B when the securement mechanism 390 is in the first position.

The securement mechanism 390 also includes a ledge 392. The ledge 392 may include one or more aperture(s) 393 that may interact with one or more features 387 of the adaptor 180B to maintain the securement mechanism 390 in the first position, as discussed above. The features 387 may be part of component 386 that is coupled to the adaptor 180B. The component 386 may also include guiding features 388C and 388D that may allow a user to align the data storage devices 120C and 120D when the data storage devices 120C and 120D are coupled to the connectors 382C and 382D. As illustrated in FIG. 4C, the data storage devices 120A and 120B, have a different size (e.g., length) than the data storage devices 120C and 120D. In other embodiments, data storage device 120A and 120C may be located on the same side. For examples, the connectors 382A and 382C may be located at different locations along the length of the adaptor 180B if data storage device 120A and 120C are located on the same side of the adaptor 180B.

Figure 5A:
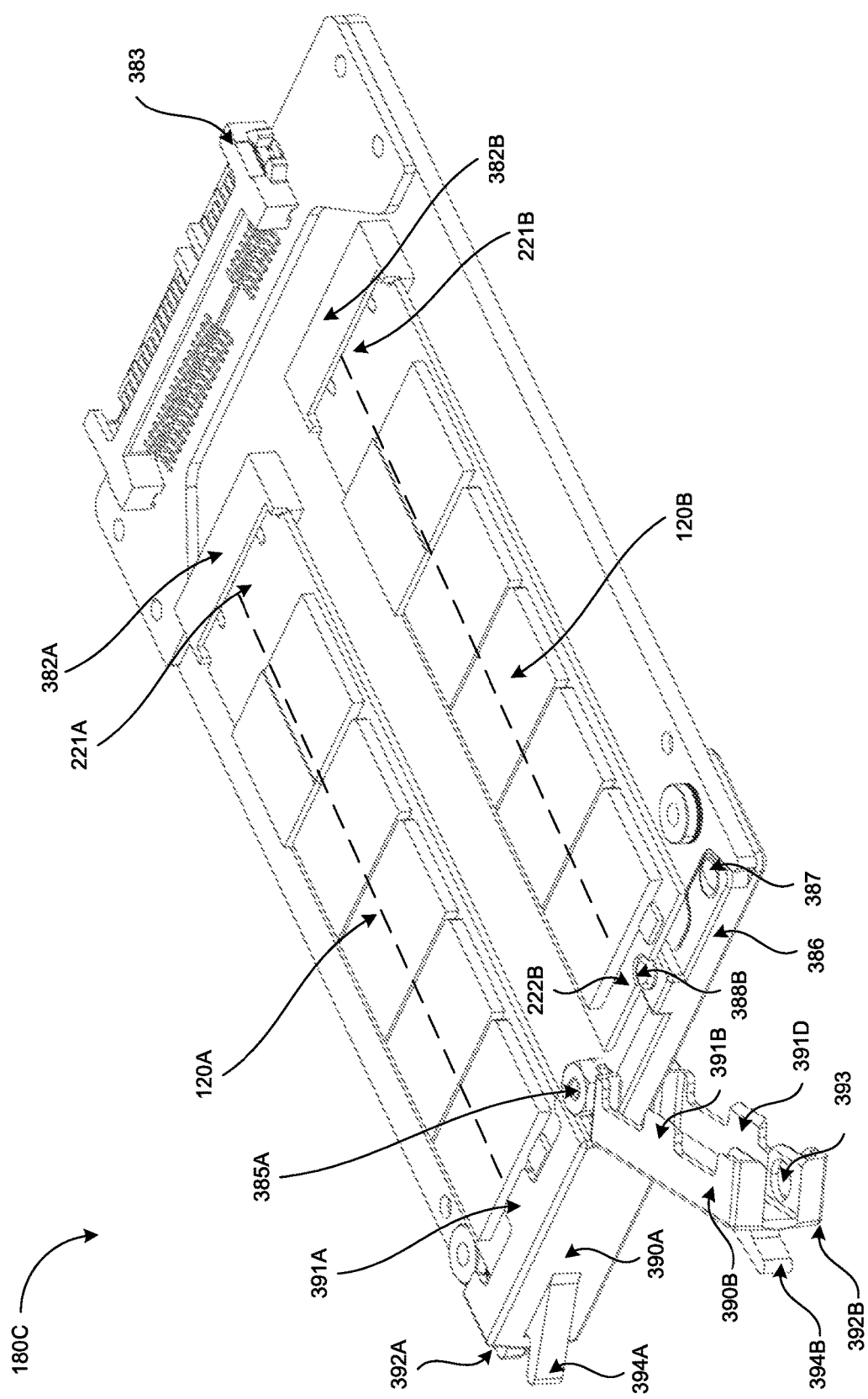
FIG. 5A illustrates a perspective view of an adaptor in accordance with one or more embodiments of the present disclosure.

FIG. 5A illustrates a perspective view of an adaptor in accordance with one or more embodiments of the present disclosure. The adaptor 180C includes securement mechanisms 390A and 390B, a printed circuit board 384, a connector 382A, a connector 382B, and a connector 383. The adaptor 180C also includes other connectors, as discussed in more detail below. The data storage device 120A may be coupled to the adaptor 180C via the connector 382A. The data storage device 120B may be coupled to the adaptor 180C via the connector 382B. The data storage devices 120A and 120B may be located on a same side of the adaptor 180C (e.g., a front, upper, first side). The securement mechanisms 390A and 390B is attached to the adaptor 180C at point 385 on the adaptor 180C. The securement mechanisms 390A and 390B may be rotatable to various positions. As illustrated in FIG. 5A, the point 385 is offset from the axes of the data storage devices 120A and 120B (indicated by the dashed lines). In other embodiments, multiple points (e.g., multiple pivot points) may be used to attach the securement mechanisms 390A and 390B to the data storage device. For example, one pivot point may be in the center of the adaptor 180C and another pivot point may be located near an edge (e.g., left/right edge) of the adaptor 180C. In another example, one pivot point may be located on the right edge of the adaptor 180C and the other pivot point may be located on the left edge of the adaptor 180C.

In one embodiment, the securement mechanism 390A be in a first position (e.g., a closed position) and the securement mechanism 390B may be in a second position (e.g., an open position). In the first position, the securement mechanism 390A may prevent the data storage device 120A from being removed from the adaptor 180C. In the second position, the securement mechanism 390B may allow the data storage device 120B to be removed from the adaptor 180C. The securement mechanism 390A includes protrusions 391A and 391B (discuss in more detail below). The securement mechanism 390B includes protrusions 391B and 391D. The protrusion 391A may secure (or help secure) the data storage device 120A to the adaptor 180C when the securement mechanism 390A is in the first position. The protrusion 391B may secure (or help secure) the data storage device 120B to the adaptor 180C when the securement mechanism 390B is in the first position. The protrusion 391C may secure (or help secure) a third data storage device (not illustrated in FIG. 5A) to the adaptor 180C when the securement mechanism 390B is in the first position.

In the first position, the protrusion 391A may interact with (e.g., touch, contact, abut, push against, etc.) the retention features the data storage device 120A. This may prevent the data storage device 120A from being moved, adjusted, removed, repositioned, etc. In the second position, the protrusion 391B may not interact with retention feature 222B of the data storage device 120B. This may allow the data storage device 120B to be moved, adjusted, removed, repositioned, etc.

The securement mechanism 390A also includes a ledge 392A and the securement mechanism 390B also includes ledge 392B. The ledges 392A and 392B may each include aperture(s) 393 that may interact with one or more features 387 of the adaptor 180C to maintain the securement mechanisms 390A and 390B in the first position, as discussed above. The features 387 may be part of component 386 that is coupled to the adaptor 180C. The component 386 may also include guiding feature 388B that may allow a user to align the data storage device 120B when the data storage device 120B is coupled to the connector 382B.

Figure 5B:
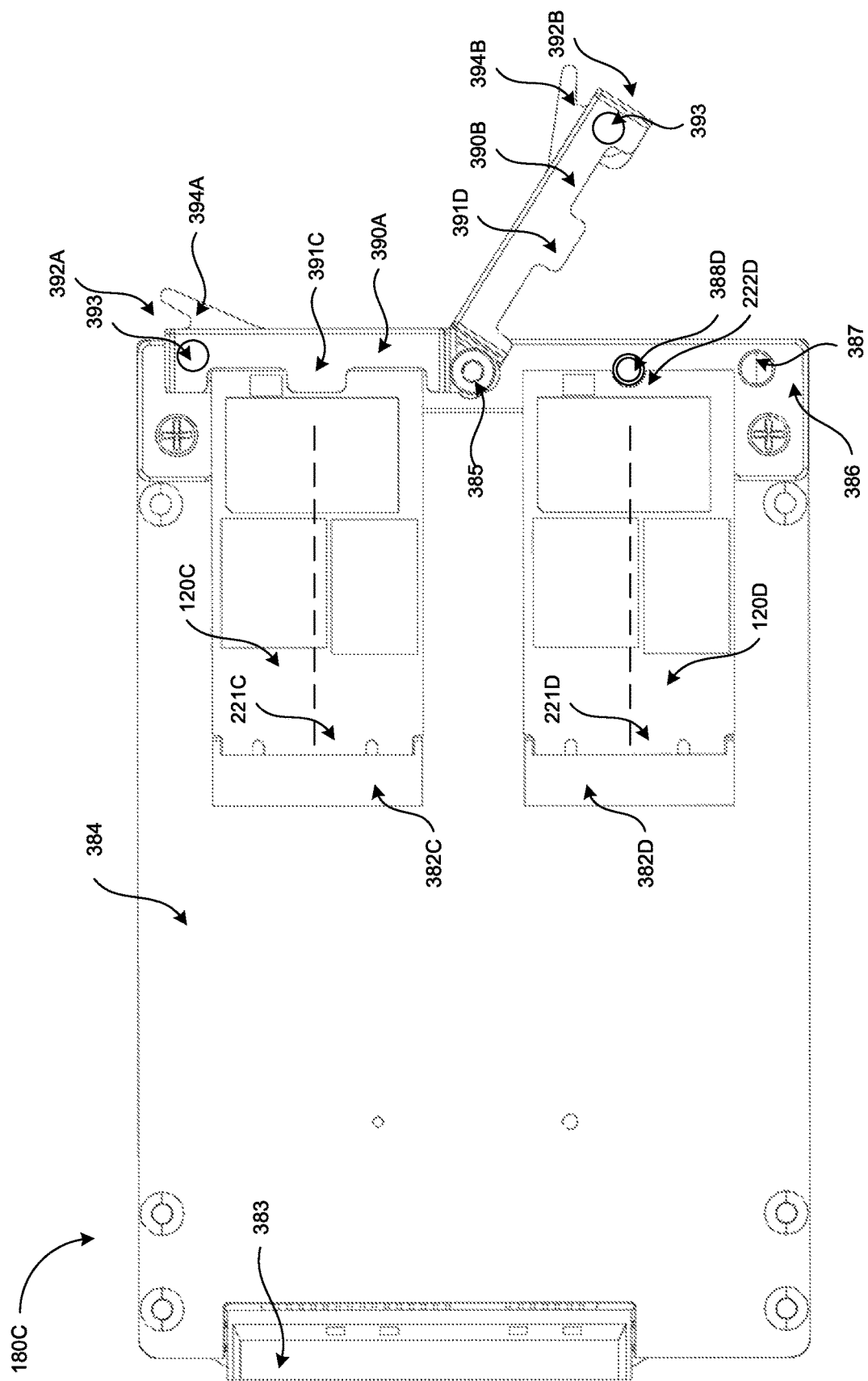
FIG. 5B illustrates a bottom view of an adaptor in accordance with one or more embodiments of the present disclosure.

FIG. 5B illustrates a bottom view of an adaptor in accordance with one or more embodiments of the present disclosure. The adaptor 180C includes securement mechanisms 390A and 390B, a printed circuit board 384, a connector 382C, a connector 382D, and a connector 383. The data storage devices 120C and 120D may be located on a same side of the adaptor 180C (e.g., a bottom, lower, second side). The securement mechanisms 390A and 390B is attached to the adaptor 180C at point 385 on the adaptor 180C.

In one embodiment, the securement mechanism 390A be in a first position (e.g., a closed position) and the securement mechanism 390B may be in a second position (e.g., an open position). The securement mechanism 390A includes protrusion 391C. The securement mechanism 390B includes protrusion 391D. The protrusion 391C may secure (or help secure) the data storage device 120C to the adaptor 180C when the securement mechanism 390A is in the first position. The protrusion 391D may secure (or help secure) the data storage device 120D to the adaptor 180C when the securement mechanism 390B is in the first position.

In the first position, the protrusion 391C may interact with (e.g., touch, contact, abut, push against, etc.) the retention features the data storage device 120C. This may prevent the data storage device 120C from being moved, adjusted, removed, repositioned, etc. In the second position, the protrusion 391D may not interact with retention feature 222D of the data storage device 120D. This may allow the data storage device 120D to be moved, adjusted, removed, repositioned, etc.

The securement mechanism 390A also includes a ledge 392A and the securement mechanism 390B also includes ledge 392B. The ledges 392A and 392B may each include aperture(s) 393 that may interact with one or more features 387 of the adaptor 180C to maintain the securement mechanisms 390A and 390B in the first position, as discussed above. The features 387 may be part of component 386 that is coupled to the adaptor 180C. The component 386 may also include guiding feature 388D that may allow a user to align the data storage device 120D when the data storage device 120D is coupled to the connector 382D.

Figure 6A:
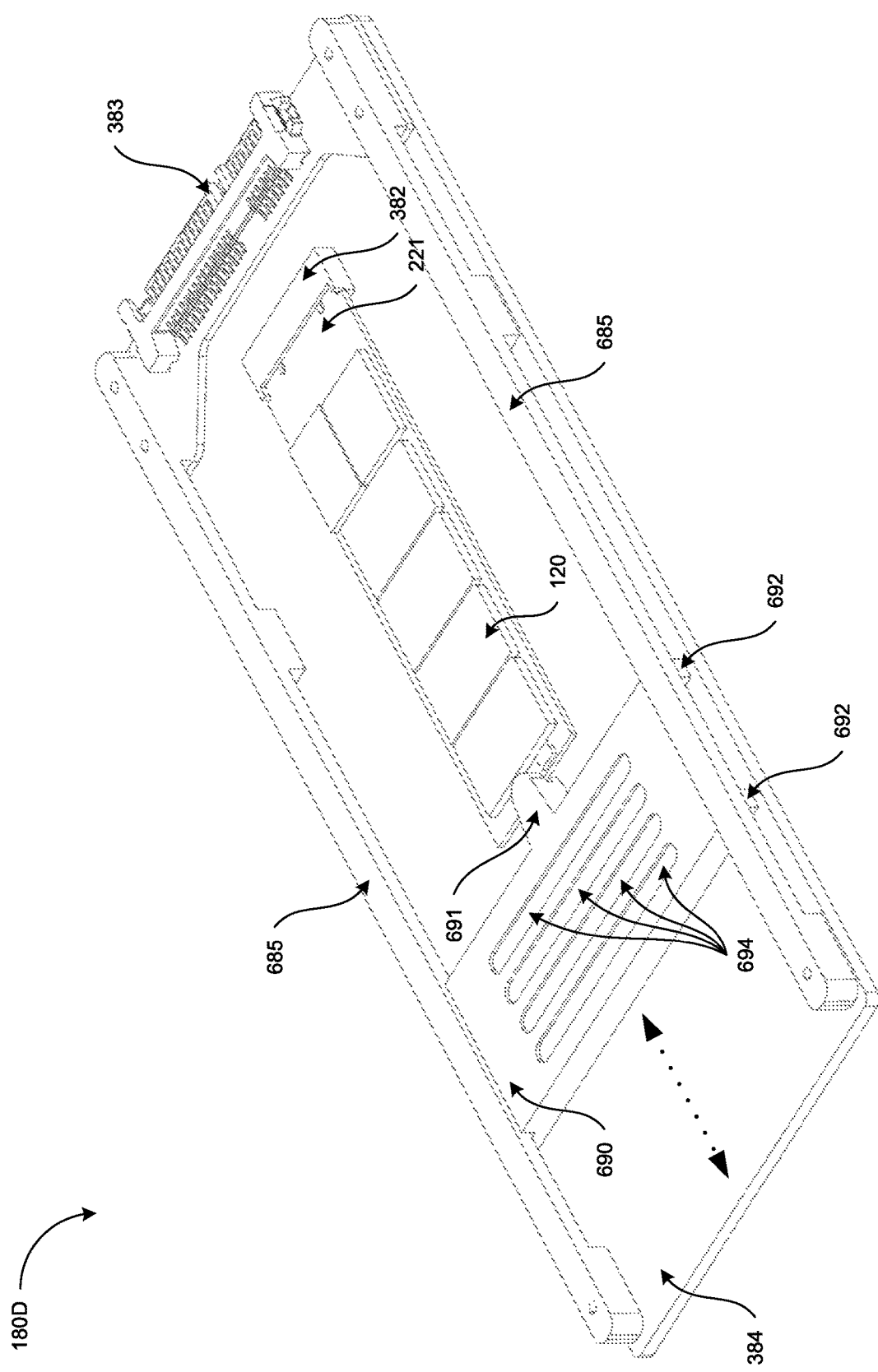
FIG. 6A illustrates a perspective view of an adaptor in accordance with one or more embodiments of the present disclosure.

FIG. 6A illustrates a perspective view of an adaptor 180D in accordance with one or more embodiments of the present disclosure. The adaptor 180D includes a securement mechanism 690, a printed circuit board 384, a connector 382, and a connector 383. The connector 382 and the connector 383 may be coupled to the printed circuit board 384. A data storage device 120 may be coupled to the adaptor 180D via the connector 382. The connector 383 may allow the adaptor 180D (and the data storage device 120) to be coupled to another device. The connector 383 and the connector 383 may be coupled to each other via pins, wires, traces, etc. This may allow data and/or power to be transmitted between the connector 382 and the connector 383.

The securement mechanism 690 is attached to the adaptor 180D via the rails 685. For example, portions of the securement mechanism 690 (e.g., the ledges 692) may be located between the rails 685 and the printed circuit board 384. In other embodiments, the ledges 692 may be located between an upper and lower rail. The width of the upper portion of the securement mechanism 690 may allow the upper portion of the securement mechanism 690 to be positioned between the rails 685. The securement mechanism 690 is movable along a longitudinal axis (e.g., the length) of the adaptor 180D. For example, the securement mechanism may be moved towards and/or away from the data storage device 120, as illustrated by the dashed arrow.

In one embodiment, the securement mechanism 690 be in a first position, as illustrated in FIG. 6A. In the first position, the securement mechanism 690 may secure the data storage device 120 to the adaptor 180D. The data storage device 120 may be irremovable from the adaptor 180D when the securement mechanism 690 is in the first position illustrated in FIG. 6A. For example, the securement mechanism 690 may prevent the data storage device 120 from being removed, uncoupled, etc., from the adaptor 180D (e.g., may prevent the data storage device 120 from being removed without damaging the data storage device 120) when the securement mechanism is in the first position. The first position may be referred to as a closed position, a secure position, a locked position, etc.

The securement mechanism 690 includes a protrusion 691. In one embodiment, the protrusion 691 may secure (or help secure) the data storage device 120 to the adaptor 180D when the securement mechanism 690 is in the first position (e.g., the closed positioned). The protrusion 691 may be a tab, abutment, etc., that may interact with a retention feature of the data storage device 120 (e.g., retention feature 222 illustrated in FIGS. 2A and 2B). For example, the portion 691 may include a notch (e.g., a gap) that may accept, interact with, contact, touch, etc., a portion of the printed circuit board of the data storage device 120. This may prevent the data storage device from being moved, adjusted, removed, repositioned, etc. For example, the protrusion 691 may keep the data storage device 120 from being pulled out of the connector 382, from being lifted, etc. The protrusion 691 may allow the securement mechanism 390 to secure the data storage device 120 to the adaptor 180A without touching other components of the data storage device (e.g., without touching flash ships, a controller, wires, pins, etc.).

The securement mechanism 690 includes ledges 692. In one embodiment, the ledges 692 may maintain (or help maintain) the securement mechanism 690 in the first position (e.g., in the closed position). For example, each ledge 692 may be a tab, abutment, a prong, etc., that may fit between the rails 685 and the printed circuit board 384. The ledges 692 may interact with one or more features (e.g., locking features) of the adaptor 180D to maintain the securement mechanism 690 in the first position (e.g., to prevent the securement mechanism 690 from moving). For example, the ledges 692 may interact with (e.g., touch, push against, abut, etc.) bumps/tabs/protrusions (not illustrated in the figures) located on the rails 685 and/or the printed circuit board 384. The bumps/tabs/protrusions (e.g., locking features) may deform to allow the securement mechanism 690 to move past the bumps/tabs/protrusions. The bumps/tabs may reform after the securement mechanism 690 moves past the bumps/tabs/protrusions. The bumps/tabs/protrusions may help prevent the securement mechanism 690 from moving out of the first position (e.g., from moving out of the closed position) by touching, pushing against, touching, etc., the ledges 692.

In one embodiment, the securement mechanism 690 also includes one or more grooves 694. The grooves 694 may assist a user in moving the securement mechanism 690 into different positions. For example, the grooves 694 may provide a surface for a user to apply pressure or force (e.g., using the user's thumb) to slide or push the securement mechanism 690 along the rails 685.

Figure 6B:
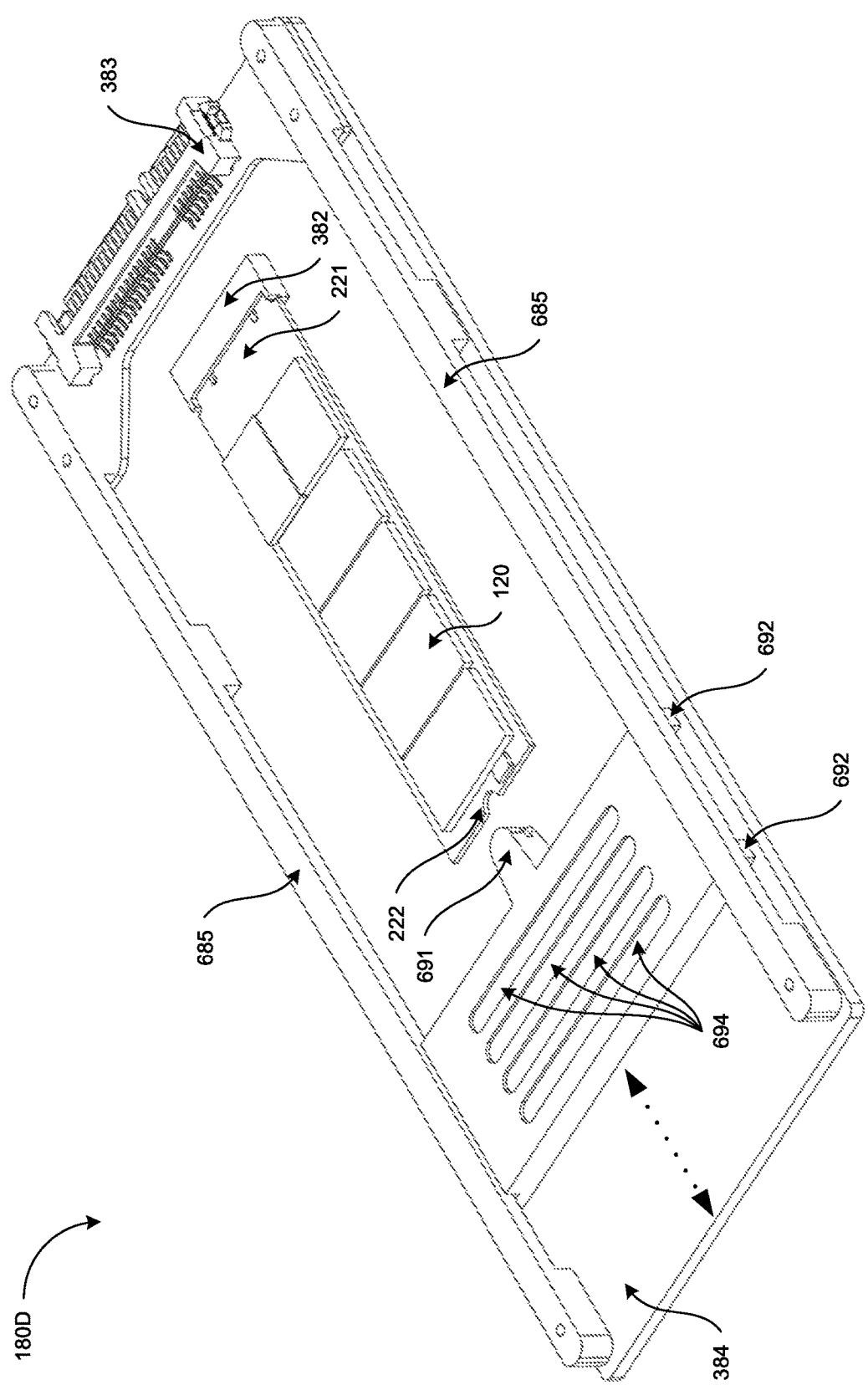
FIG. 6B illustrates a perspective view of an adaptor in accordance with one or more embodiments of the present disclosure.

FIG. 6B illustrates a perspective view of an adaptor in accordance with one or more embodiments of the present disclosure. The adaptor 180D includes a securement mechanism 690, a printed circuit board 384, a connector 382, and a connector 383. The data storage device 120 may be coupled to the adaptor 180D via the connector 382. The securement mechanism 690 is attached to the adaptor 180D via the rails 685. The securement mechanism 690 is movable along a longitudinal axis (e.g., the length) of the adaptor 180D.

In one embodiment, the securement mechanism 690 be in a second position, as illustrated in FIG. 6B. In the second position, the securement mechanism 690 may allow the data storage device 120 to be removed from the adaptor 180D. The data storage device 120 may be removable from the adaptor 180D when the securement mechanism 690 is in the second position illustrated in FIG. 6B. The second position may be referred to as an open position, a free position, an accessible position, etc.

The securement mechanism 690 includes a protrusion 691. In the second position, the protrusion 691 may not interact with the retention feature 222 of the data storage device 120. This may allow the data storage device 120 to be removed from the adaptor 180D (e.g., the data storage device 120 may be removable).

The securement mechanism 690 includes ledges 692. In one embodiment, the ledges 692 may maintain (or help maintain) the securement mechanism 690 in the first position, as discussed above. The ledges 692 may interact with one or more features (e.g., locking features) of the adaptor 180D to maintain the securement mechanism 690 in the first position. The bumps/tabs/protrusions (e.g., locking features) may deform to allow the securement mechanism 690 to move past the bumps/tabs/protrusions. The bumps/tabs may reform after the securement mechanism 690 moves past the bumps/tabs/protrusions. The bumps/tabs/protrusions may help prevent the securement mechanism 690 from moving out of the first position by touching, pushing against, touching, etc., the ledges 692. The bumps/tabs/protrusions may be located on the printed circuit board 384 and/or may be located on the rails 685. The securement mechanism 690 also includes one or more grooves 694. The grooves 694 may assist a user in moving the securement mechanism 690 into different positions.

Figure 7A:
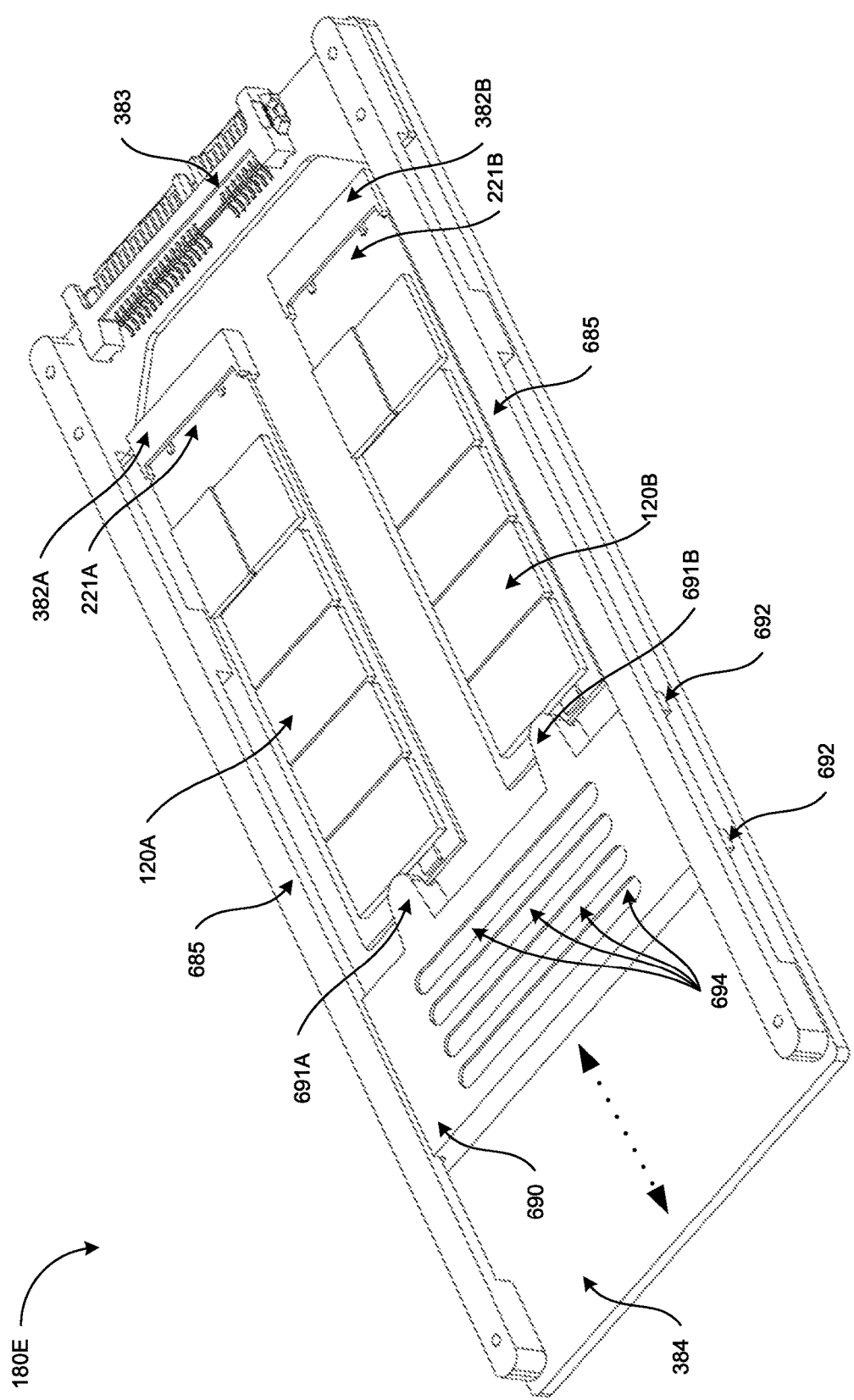
FIG. 7A illustrates a perspective view of an adaptor in accordance with one or more embodiments of the present disclosure.

FIG. 7A illustrates a perspective view of an adaptor 180E in accordance with one or more embodiments of the present disclosure. The adaptor 180E includes a securement mechanism 690, a printed circuit board 384, a connector 382, and a connector 383. The data storage device 120A may be coupled to the adaptor 180E via the connector 382A. The data storage device 120B may be coupled to the adaptor 180E via the connector 382B. The securement mechanism 690 is attached to the adaptor 180E via the rails 685. The securement mechanism 690 is movable along a longitudinal axis (e.g., the length) of the adaptor 180E.

In one embodiment, the securement mechanism 690 may be in a first position, as illustrated in FIG. 7A. In the first position, the securement mechanism 690 may secure the data storage device 120 to the adaptor 180E. The data storage devices 120A and 120B may be irremovable from the adaptor 180E when the securement mechanism 690 is in the first position illustrated in FIG. 7A. The first position may be referred to as a closed position, a secure position, a locked position, etc.

The securement mechanism 690 includes protrusions 691A and 691B. In one embodiment, the protrusions 691A and 691B may secure (or help secure) the data storage devices 120A and 120B to the adaptor 180E when the securement mechanism 690 is in the first position (e.g., the closed positioned). The protrusions 691A and 691B (e.g., a tab, a protrusion, etc.) may each interact with a retention feature of the data storage devices 120A and 120B. Each of the protrusions 691A and 691B may include a notch (e.g., a gap) that may accept, interact with, contact, touch, etc., a portion of the printed circuit board of a data storage device.

The securement mechanism 690 includes ledges 692. The ledges 692 may maintain (or help maintain) the securement mechanism 690 in the first position, as discussed above. The ledges 692 may interact with one or more features (e.g., locking features) of the adaptor 180E to maintain the securement mechanism 690 in the first position. The locking features (e.g., bumps/tabs/protrusions) may help maintain the securement mechanism 690 in different positions. The securement mechanism 690 also includes one or more grooves 694. The grooves 694 may assist a user in moving the securement mechanism 690 into different positions.

Figure 7B:
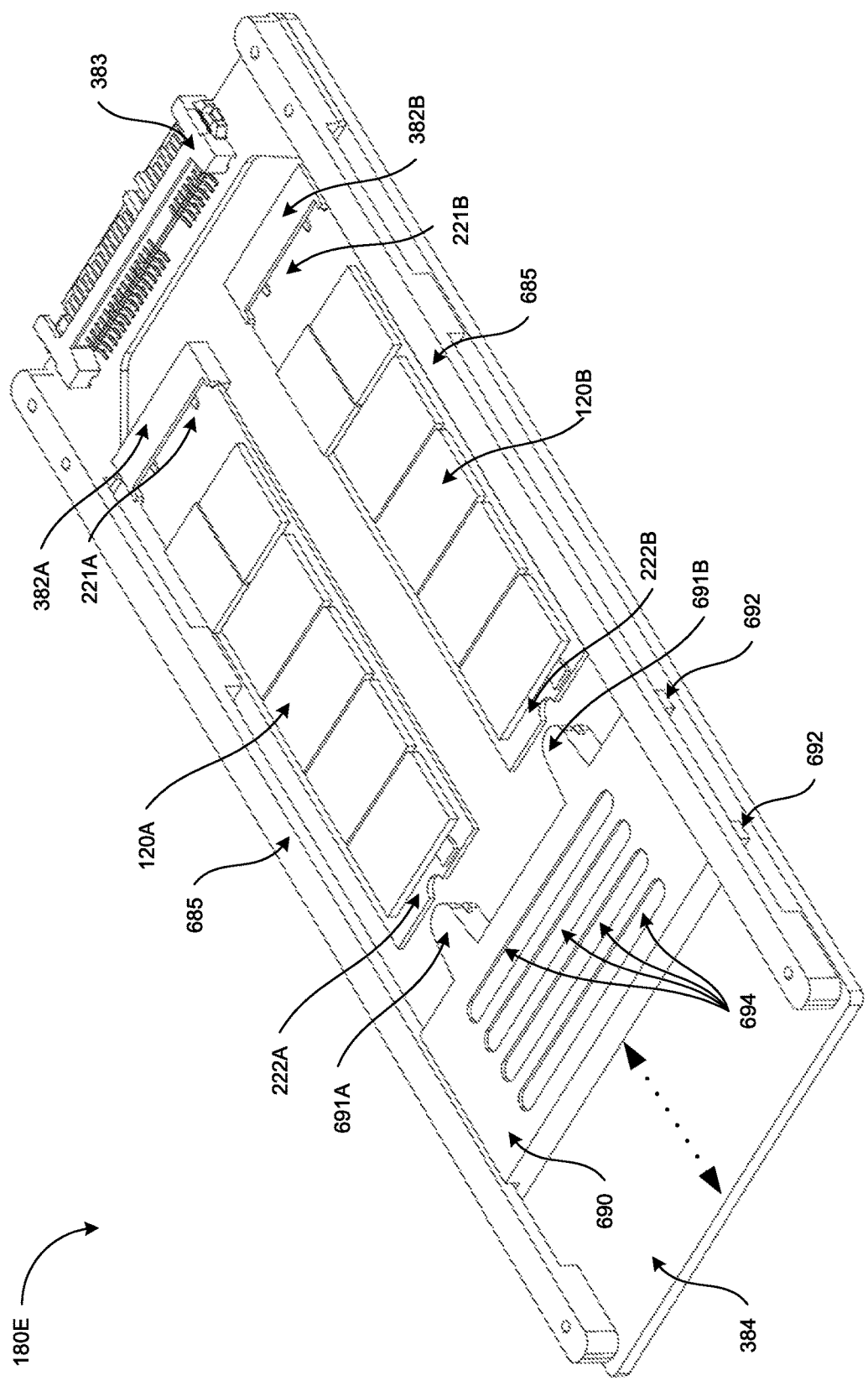
FIG. 7B illustrates a perspective view of an adaptor in accordance with one or more embodiments of the present disclosure.

FIG. 7B illustrates a perspective view of an adaptor in accordance with one or more embodiments of the present disclosure. The adaptor 180E includes a securement mechanism 690, a printed circuit board 384, a connector 382, and a connector 383. The data storage device 120A may be coupled to the adaptor 180E via the connector 382A. The data storage device 120B may be coupled to the adaptor 180E via the connector 382B. The securement mechanism 690 is attached to the adaptor 180E via the rails 685. The securement mechanism 690 is movable along a longitudinal axis (e.g., the length) of the adaptor 180E, as illustrated by the dashed arrow.

In one embodiment, the securement mechanism 690 be in a second position, as illustrated in FIG. 7B. In the second position, the securement mechanism 690 may allow the data storage devices 120A and 120B to be removed from the adaptor 180E. The data storage devices 120A and 120B may be removable from the adaptor 180E when the securement mechanism 690 is in the second position illustrated in FIG. 7B. The second position may be referred to as an open position, a free position, an accessible position, etc.

The securement mechanism 690 includes protrusions 691A and 691B. In the second position, the protrusions 691A and 691B may not interact with (e.g., may not touch, interface with, etc.) the retention features 222A and 222B. The securement mechanism 690 includes ledges 692. The ledges 692 may maintain (or help maintain) the securement mechanism 690 in the first position, as discussed above. The ledges 692 may interact with one or more features (e.g., locking features) of the adaptor 180E to maintain the securement mechanism 690 in different positions.

Figure 8:
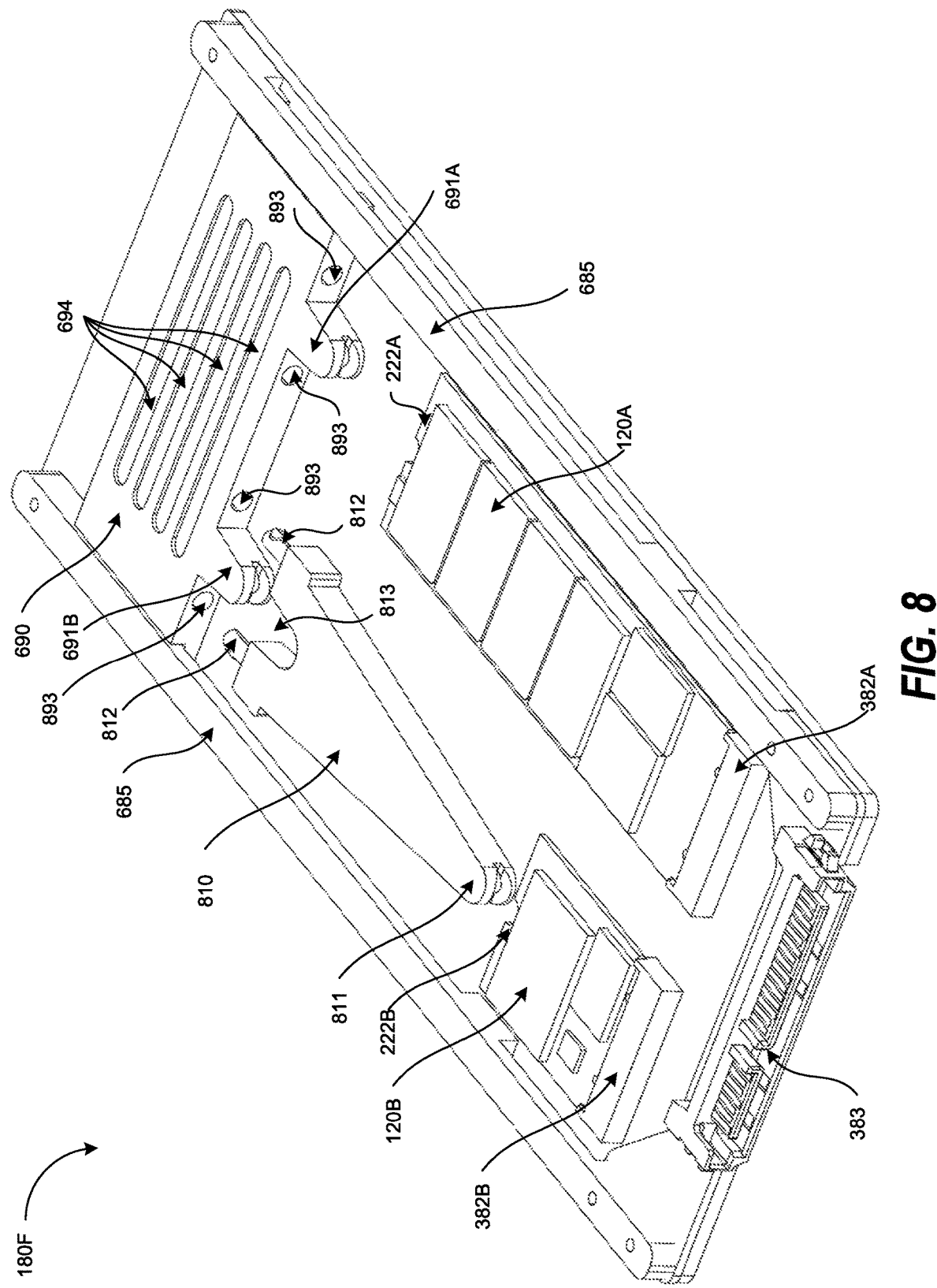
FIG. 8 illustrates a perspective view of an adaptor in accordance with one or more embodiments of the present disclosure.

FIG. 8 illustrates a top view of an adaptor in accordance with one or more embodiments of the present disclosure. The adaptor 180F includes a securement mechanism 690, a printed circuit board 384, a connector 382, and a connector 383. The data storage device 120A may be coupled to the adaptor 180F via the connector 382A. The data storage device 120B may be coupled to the adaptor 180F via the connector 382B. The securement mechanism 690 is attached to the adaptor 180F via the rails 685. The securement mechanism 690 is movable along a longitudinal axis (e.g., the length) of the adaptor 180F.

In one embodiment, the securement mechanism 690 be in a second position, as illustrated in FIG. 7B. In the second position, the securement mechanism 690 may allow the data storage device 120 to be removed from the adaptor 180F. The data storage devices 120A and 120B may be removable from the adaptor 180F when the securement mechanism 690 is in the second position illustrated in FIG. 7B. The second position may be referred to as an open position, a free position, an accessible position, etc.

The securement mechanism 690 includes protrusions 691A and 691B. In one embodiment, the protrusions 691A and 691B may secure (or help secure) the data storage devices 120A and 120B to the adaptor 180F when the securement mechanism 690 is in the first position (e.g., the closed positioned). The securement mechanism 690 includes ledges 692. The ledges 692 may maintain (or help maintain) the securement mechanism 690 in the first position, as discussed above. The ledges 692 may interact with one or more features (e.g., locking features) of the adaptor 180F to maintain the securement mechanism 690 in the different positions.

The adaptor 180F also includes an insert 810. The insert 810 may include prongs 812 (e.g., tabs, protrusions, etc.) that may be inserted into aperture(s) 893 in the securement mechanism 690. The insert 810 also includes a gap 813 that may interact with (e.g., may accept, may fit with, may touch, may contact, etc.) the protrusion 691B. For example, the gap 813 may have the same shape as the protrusion 691B. The gap 813 and the prongs 812 allow the insert 810 to be coupled to the securement mechanism 690. The prongs 812 may include features (e.g., smaller bumps, tabs, etc.) that are deformable which may allow the prongs 812 to provide some resistance against the removal of the insert 810. When enough force is applied, the prongs 812 may be inserted into the apertures 893 and may remain in the apertures 893 to attach (e.g., secure) the insert 810 to the securement mechanism 890. In addition, the insert 810 may also be removable from the securement mechanism 690. For example, when enough force is applied, the tabs on the prongs 812 may deform to allow the insert 810 to be removed from the securement mechanism 690.

The insert 810 also includes a portion 811. The size, shape, layout, and/or configuration of portion 811 may be similar to protrusion 691B. The portion 811 may include a notch that may accept, interact with, contact, touch, etc., retention feature 222B of the data storage device 120B. The insert 810 may allow the securement mechanism 690 to secure data storage devices that are shorter than data storage device 120A, to the adaptor 180F. For example, data storage device 120B is not as long as data storage device 120A. Thus, the protrusion 691B may not reach the retention feature 222B of the data storage device 120B. The insert 810 may bridge the gap, space, etc., between the protrusion 691B (or 691A) and a shorter data storage device (e.g., a data storage device that is not as long as data storage device 120A). After the insert 810 is attached to the securement mechanism 690, the securement mechanism 690 may be moved (e.g., pushed, slid, etc.) towards the data storage devices 120A and 120B to secure the data storage devices 120A and 120B to the adaptor 180F.

Figure 9A:
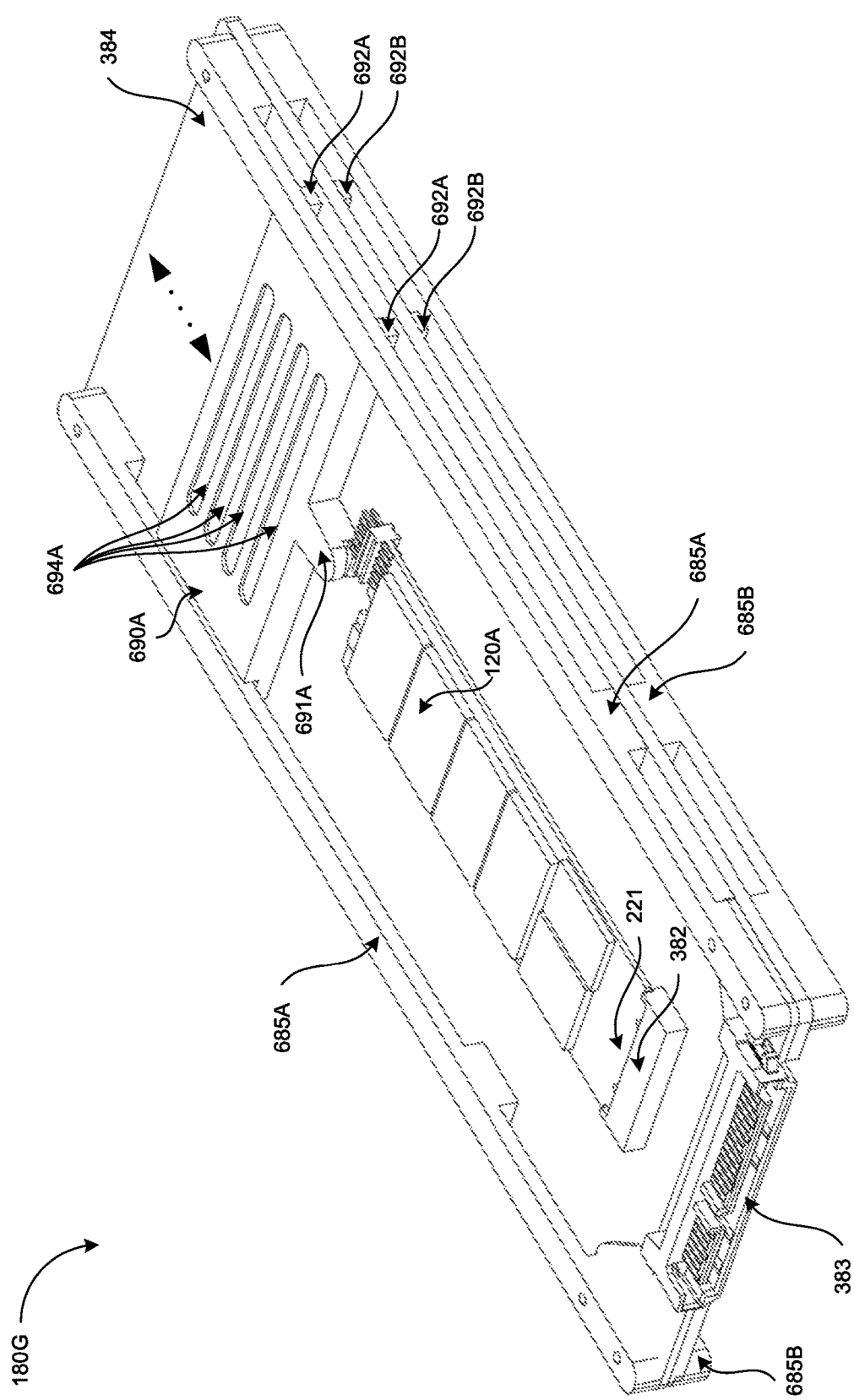
FIG. 9A illustrates a perspective view of an adaptor in accordance with one or more embodiments of the present disclosure.

FIG. 9A illustrates a perspective view of an adaptor 180G in accordance with one or more embodiments of the present disclosure. The perspective view may be a perspective view of a top/upper/first side of the adaptor 180G. The adaptor 180G includes a securement mechanism 690A, a printed circuit board 384, a connector 382, and a connector 383. The adaptor 180G also includes a second securement mechanism 690B discussed in more detail below. The data storage device 120A may be coupled to the adaptor 180G via the connector 382. The securement mechanism 690A is attached to the adaptor 180G via the rails 685A. The securement mechanism 690A is movable along a longitudinal axis (e.g., the length) of the adaptor 180G, as illustrated by the dashed arrow.

In one embodiment, the securement mechanism 690A be in a second position, as illustrated in FIG. 9A. In the second position, the securement mechanism 690A may allow the data storage device 120A to be removed from the adaptor 180G. The data storage device 120A may be removable from the adaptor 180G when the securement mechanism 690 is in the second position illustrated in FIG. 9A. The second position may be referred to as an open position, a free position, an accessible position, etc.

The securement mechanism 690A includes a protrusion 691A. In one embodiment, the protrusion 691A may secure (or help secure) the data storage device 120A to the adaptor 180G when the securement mechanism 690A is in the first position (e.g., the closed positioned). In the second position, the protrusion 691 may not interact with the retention feature 222 of the data storage device 120A. This may allow the data storage device 120A to be removed from the adaptor 180G (e.g., the data storage device 120A may be removable).

The securement mechanism 690 includes ledge 692A. In one embodiment, the ledge 692A may maintain (or help maintain) the securement mechanism 690A in the first position, as discussed above. The portions 692A may interact with one or more features (e.g., locking features) of the adaptor 180G to maintain the securement mechanism 690A in different positions. The securement mechanism 690A also includes one or more grooves 694A. The grooves 694A may assist a user in moving the securement mechanism 690A into different positions.

FIG. 9B illustrates a perspective view of an adaptor in accordance with one or more embodiments of the present disclosure. The perspective view may be a perspective view of a second/bottom/lower side of the adaptor 180G. The adaptor 180G includes a securement mechanism 690B, a printed circuit board 384, a connector 382, and a connector 383. The adaptor 180G also includes a second securement mechanism 690B discussed above. The data storage devices 120B and 120C may be coupled to the adaptor 180G via the connectors 382B and 382C. The securement mechanism 690B is attached to the adaptor 180G via the rails 685B. The securement mechanism 690B is movable along a longitudinal axis (e.g., the length) of the adaptor 180G, as illustrated by the dashed arrow.

In one embodiment, the securement mechanism 690B be in a first position, as illustrated in FIG. 9B (e.g., a closed position). In the first position, the securement mechanism 690B may secure the data storage devices 120B and 120C to the adaptor 180G. The data storage devices 120B and 120C may irremovable from the adaptor 180G when the securement mechanism 690 is in the first position illustrated in FIG. 9B. The first position may be referred to as a closed position, a locked position, a secure position, etc.

The securement mechanism 690B includes protrusions 691B and 691C. In one embodiment, the protrusions 691B and 691C may secure (or help secure) the data storage devices 120B and 120C to the adaptor 180G when the securement mechanism 690B is in the first position (e.g., the closed positioned). The protrusions 691B and 691C (e.g., a tab, abutment, etc.) may interact with a retention features of the data storage devices 120B and 120C. The protrusions 691B and 691C may each include a notch (e.g., a gap) that may accept, interact with, contact, touch, etc., a portion of the printed circuit board of the data storage devices 120B and 120C.

The securement mechanism 690B includes ledge 692B. In one embodiment, the ledge 692B may maintain (or help maintain) the securement mechanism 690B in the first position, as discussed above. The portions 692B may interact with one or more features (e.g., locking features) of the adaptor 180G to maintain the securement mechanism 690B in different positions. The securement mechanism 690B also includes one or more grooves 694B. The grooves 694B may assist a user in moving the securement mechanism 690B into different positions.

In other embodiments, different numbers of data storage devices may be located on different sides of an adaptor. Various configurations of connectors and/or securement mechanisms may be used in different embodiments. For example, a first side of the adaptor may be similar to adaptor 180E illustrated in FIG. 7A, and second side of the adaptor may be similar to adaptor 180G. In another example, both sides of an adaptor may be similar to the adaptor 180D illustrated in FIG. 6A. In a further example, one side of the adaptor may be similar to the adaptor 180F illustrated in FIG. 8 and the other side of the adaptor may similar to the adaptor 180G.

General Comments

Those skilled in the art will appreciate that in some embodiments, other types of distributed data storage systems may be implemented while remaining within the scope of the present disclosure. In addition, the actual steps taken in the processes discussed herein may differ from those described or shown in the figures. Depending on the embodiment, certain of the steps described above may be removed, others may be added.

While certain embodiments have been described, these embodiments have been presented by way of example only, and are not intended to limit the scope of protection. Indeed, the novel methods and systems described herein may be embodied in a variety of other forms. Furthermore, various omissions, substitutions and changes in the form of the methods and systems described herein may be made. The accompanying claims and their equivalents are intended to cover such forms or modifications as would fall within the scope and spirit of the protection. For example, the various components illustrated in the figures may be implemented as software and/or firmware on a processor, ASIC/FPGA, or dedicated hardware. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this disclosure, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this disclosure and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such. Furthermore, the terms "first," "second," "third," "fourth," etc., as used herein are meant as labels to distinguish among different elements and may not necessarily have an ordinal meaning according to their numerical designation.

All of the processes described above may be embodied in, and fully automated via, software code modules executed by one or more general purpose or special purpose computers or processors. The code modules may be stored on any type of computer-readable medium or other computer storage device or collection of storage devices. Some or all of the methods may alternatively be embodied in specialized computer hardware.

What is claimed is:

1. An apparatus, comprising:
   a printed circuit board;
   a first connector coupled to the printed circuit board, wherein the first connector couples the apparatus to a computing device;
   a second connector coupled to the printed circuit board, wherein the second connector couples the apparatus to a first data storage device; and
   a plurality of securement mechanisms disposed at a proximal end of the apparatus, wherein each of the plurality of securement mechanisms is rotatable about a point on the apparatus between a first position and a second position, each of the plurality of securement mechanisms comprising:
   a ledge comprising an aperture, wherein the aperture interacts with a component comprising one or more features of the apparatus to maintain a respective securement mechanism of the plurality of securement mechanisms in the first position, the component further comprising a guiding feature which aligns the apparatus when coupled to either the first or the second connector;
   wherein the one or more features of the apparatus deforms to insert into at least one of the apertures;
   a protrusion interacts with a retention feature of the apparatus; and
   an engagement adjusts a respective securement mechanism of the plurality of securement mechanisms into the first position;
   wherein the first position prevents each of the plurality of securement mechanisms from moving, and wherein the second position prevents the protrusion from interacting with the retention feature.

2. The apparatus of claim 1, wherein the engagement of the respective securement mechanism of the plurality of securement mechanisms further comprises a tab.

3. The apparatus of claim 1, wherein the respective securement mechanism of the plurality of securement mechanisms comprises a latch rotatable about the point on the apparatus.

4. The apparatus of claim 1, wherein the point on the apparatus is offset from a center axis of the first data storage device.

5. The apparatus of claim 1, further comprising a third connector coupled to the printed circuit board, wherein the third connector is couples the apparatus to a second data storage device.

6. The apparatus of claim 5, wherein:
   the protrusion secures the first data storage device to the apparatus when at least one of the plurality of securement mechanisms is in the first position.

7. The apparatus of claim 5, wherein:
   the first data storage device and the second data storage device are located on a same side of the printed circuit board;
   at least one of the plurality of securement mechanisms is movable between a third position and a fourth position, and comprises a portion which maintains the at least one of the plurality of securement mechanisms at the third position.

8. The apparatus of claim 1, wherein:
   the first data storage device is irremovable from the apparatus when at least one of the plurality of securement mechanisms is in the first position; and
   the first data storage device is removable from the apparatus when the at least one of the plurality of securement mechanisms is in the second position.

* * * * *